(12) United States Patent
Mizushima et al.

(10) Patent No.: US 8,957,461 B2
(45) Date of Patent: Feb. 17, 2015

(54) SCHOTTKY BARRIER DIODE HAVING A TRENCH STRUCTURE

(71) Applicant: Fuji Electric Co., Ltd., Kawasaki-shi (JP)

(72) Inventors: Tomonori Mizushima, Matsumoto (JP); Michio Nemoto, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 35 days.

(21) Appl. No.: 13/952,741

(22) Filed: Jul. 29, 2013

(65) Prior Publication Data

US 2013/0307111 A1 Nov. 21, 2013

Related U.S. Application Data

(63) Continuation of application No. 12/984,140, filed on Jan. 4, 2011, now abandoned.

(30) Foreign Application Priority Data

Jan. 5, 2010 (JP) ................................. 2010-000469

(51) Int. Cl.
*H01L 29/872* (2006.01)
*H01L 29/06* (2006.01)
*H01L 29/40* (2006.01)

(52) U.S. Cl.
CPC .......... *H01L 29/872* (2013.01); *H01L 29/0661* (2013.01); *H01L 29/402* (2013.01); *H01L 29/407* (2013.01); *H01L 29/8725* (2013.01)
USPC ........... 257/280; 257/267; 257/367; 257/476; 257/73; 257/155; 257/284

(58) Field of Classification Search
USPC ............ 257/267, 476, 367, 73, 155, 280, 284
See application file for complete search history.

(56) References Cited

U.S. PATENT DOCUMENTS 6,396,090 B1 * 5/2002 Hsu et al. ...................... 257/242
6,566,726 B1 * 5/2003 Onose et al. .................. 257/490

(Continued)

FOREIGN PATENT DOCUMENTS

JP 2002-050773 A 2/2002
JP 2002-334997 A 11/2002

(Continued)

OTHER PUBLICATIONS

Mehrotra, Manoj et al. "Trench Mos Barrier Schottky (TMBS) Rectifier: A Schottky Rectifier with Higher Than Parallel Plane Breakdown Voltage" Solid-State Electronics, 1995, pp. 801-806, vol. 38 No. 4. Elsevier Science Ltd. Great Britain (Cited in parent U.S. Appl. No. 12/984,140).

*Primary Examiner* — Eugene Lee
(74) *Attorney, Agent, or Firm* — Rossi, Kimms & McDowell LLP

(57) ABSTRACT

A TMBS diode is disclosed. In an active portion and voltage withstanding structure portion of the diode, an end portion trench surrounds active portion trenches. An active end portion which is an outer circumferential side end portion of an anode electrode is in contact with conductive polysilicon inside the end portion trench. A guard trench is separated from the end portion trench and surrounds it. A field plate provided on an outer circumferential portion of the anode electrode is separated from the anode electrode, and contacts both part of a surface of n-type drift layer in a mesa region between the end portion trench and the guard trench and the conductive polysilicon formed inside the guard trench. The semiconductor device has high withstand voltage without injection of minority carriers, and relaxed electric field intensity of the trench formed in an end portion of an active portion.

8 Claims, 15 Drawing Sheets

1 N-Type Semiconductor Substrate
2 N-Type Drift Layer
3 Anode Electrode
4 Cathode Electrode
6 Interlayer Insulating Film
7 End Portion Trench
8 Guard Trench
9 Field Plate
11 Oxide Film
12 Active Portion Trench
13 Polysilicon
16 Schottky Barrier Junction
18 Mesa Region
19 Active End Portion
21 Active Portion
22 Voltage Withstanding Structure Portion

(56) References Cited

U.S. PATENT DOCUMENTS

| | | | |
|---|---|---|---|
| 6,740,951 B2 * | 5/2004 | Tsui et al. | 257/483 |
| 6,833,584 B2 | 12/2004 | Henninger et al. | |
| 7,323,402 B2 | 1/2008 | Chiola | |
| 7,655,975 B2 | 2/2010 | Hirler et al. | |
| 8,080,858 B2 | 12/2011 | Hirler et al. | |
| 8,217,419 B2 | 7/2012 | Takaishi | |
| 2002/0134998 A1 | 9/2002 | Van Dalen et al. | |
| 2008/0042172 A1 | 2/2008 | Hirler et al. | |
| 2010/0264488 A1 | 10/2010 | Hsieh | |
| 2010/0327288 A1 | 12/2010 | Chao et al. | |

FOREIGN PATENT DOCUMENTS

| | | |
|---|---|---|
| JP | 2004-519103 A | 6/2004 |
| JP | 2008-244371 A | 10/2008 |
| JP | 2008-251757 A | 10/2008 |

* cited by examiner

1 N-Type Semiconductor Substrate
2 N-Type Drift Layer
3 Anode Electrode
4 Cathode Electrode
6 Interlayer Insulating Film
7 End Portion Trench
8 Guard Trench
9 Field Plate 11 Oxide Film
12 Active Portion Trench
13 Polysilicon
16 Schottky Barrier Junction
18 Mesa Region
19 Active End Portion
21 Active Portion
22 Voltage Withstanding Structure Portion 1 N-Type Semiconductor Substrate
2 N-Type Drift Layer
3 Anode Electrode
4 Cathode Electrode
6 Interlayer Insulating Film
7 End Portion Trench
8 Guard Trench
9 Field Plate 11 Oxide Film
13 Polysilicon
16 Schottky Barrier Junction
18 Mesa Region
19 Active End Portion
21 Active Portion
22 Voltage Withstanding Structure Portion 1 N-Type Semiconductor Substrate
2 N-Type Drift Layer
3 Anode Electrode
4 Cathode Electrode
6 Interlayer Insulating Film
7 End Portion
8 Guard Trench
9 Field Plate 10 P-Type Floating Layer
11 Oxide Film
13 Polysilicon
16 Schottky Barrier Junction
18 Mesa Region
19 Active End Portion
21 Active Portion
22 Voltage Withstanding Structure Portion 1 N-Type Semiconductor Substrate
2 N-Type Drift Layer
3 Anode Electrode
4 Cathode Electrode
6 Interlayer Insulating Film
7 End Portion Trench
8 Guard Trench
9 Field Plate 11 Oxide Film
12 Active Portion Trench
13 Polysilicon
16 Schottky Barrier Junction
17 N-Type Surface Layer
18 Mesa Region
19 Active End Portion
21 Active Portion
22 Voltage Withstanding Structure Portion

SCHOTTKY BARRIER DIODE HAVING A TRENCH STRUCTURE

This application is a Continuation Application of U.S. patent application Ser. No. 12/984,140 filed on Jan. 4, 2011 which is based on and claims priority from JP 2010-000469 filed on Jan. 5, 2010 the contents of which is incorporated in its entirety by reference.

BACKGROUND OF THE INVENTION

A. Field of the Invention

The present invention relates to a semiconductor device and particularly relates to a structure of a Schottky Barrier Diode (hereinafter abbreviated to SBD) having a trench structure.

B. Description of the Related Art

FIG. 15 shows a sectional structure of a Trench MOS Barrier Schottky diode (hereinafter referred to as TMBS diode) which is an SBD having a trench structure. N-type drift layer 2 and anode electrode 3 are formed in a surface of the TMSB diode. N-type drift layer 2 and anode electrode 3 form a Schottky barrier junction. Active portion trenches 12 having inner walls covered with oxide films 11 respectively are formed at regular intervals in active portion 21 which serves as a current path at the time of current conduction. The inside of each active portion trench 12 is filled with the same metal as that of the anode electrode or with a conductor such as conductive polysilicon. When a reverse bias voltage is applied to the TMBS diode, a depletion layer is spread from the Schottky barrier junction of anode electrode 3 and n-type drift layer 2. When the depletion layer becomes deeper than the bottom of each trench, isoelectric lines are concentrated in oxide film 11 which is formed in the bottom of each trench and which is lower in dielectric constant than silicon, so that electric field intensity in the vicinity of the Schottky barrier junction is relatively lowered. As a result, not only can a barrier height reducing phenomenon be suppressed to reduce a leakage current but also the applied voltage can be shared with the oxide film. Accordingly, a withstand voltage can be improved due to a well-known RESURF (Reduced Surface Electric Field) effect compared with a conventional SBD. Moreover, because the doping concentration of n-type drift layer 2 can be increased due to the RESURF effect, lower on-resistance can be achieved at the same leakage current as that of the conventional SBD regardless of a high withstand voltage.

Voltage withstanding structure portion 22 (an electric field relaxing region formed on the outer circumferential side of active portion 21) is formed in a peripheral region of anode electrode 3. A trench is formed in an end portion (hereinafter referred to as active end portion 19) of anode electrode 3. Anode electrode 3 is terminated in an upper portion of polysilicon 13 embedded in the trench. The trench formed in active end portion 19 is hereinafter referred to as end portion trench 7. P-type guard ring layer 5 is formed between active portion trenches 12 and end portion trench 7 so as to be connected to anode electrode 3. Though not shown, a structure in which p-type guard ring layer 5 is removed may be provided. Particularly when there is no p-type guard ring layer 5, active end portion 19 is terminated in an upper surface of polysilicon 13 embedded in the end portion trench 7 so that active end portion 19 is not in direct contact with n-type drift layer 2. In this manner, electric field intensity is prevented from increasing locally in n-type drift layer 2 near active end portion 19 when a reverse bias is applied to the TMBS diode.

A method of processing a lengthwise end portion of each active portion trench 12 and a positional relation between active portion trench 12 and end portion trench 7 will be described next. FIGS. 16A and 16B are plan views showing the positional relation between active portion trench 12 and end portion trench 7 based on a conventional conception. Although description of a sidewall oxide film formed in each of the trenches and polysilicon 13 embedded in each of the trenches will be omitted, FIGS. 16A and 16B actually include the sidewall oxide film and polysilicon 13. In FIG. 16A, one active portion trench 12 is processed so as to be connected to another adjacent active portion trench 12 at lengthwise end portions of active portion trenches 12. That is, active portion trenches 12 are shaped like a doughnut so that active portion trenches 12 are adjacent to each other. Such end portion processing is a method often seen in the layout of a plurality of long and narrow trench gates in a trench gate MOSFET or IGBT. As shown in FIG. 16B, there is another method in which each active portion trench 12 is terminated at its lengthwise end portion. In this case, the end portion of each active portion trench 12 is terminated with a semi-circular shape having the width of the trench as its diameter.

JP-A-2002-50773

It has been however found that the following problem arises in such a conventional structure. When a high reverse bias is applied between anode electrode 3 and cathode electrode 4, electric field intensity is concentrated in the vicinity of the outer circumferential side bottom of end portion trench 7 of active portion 21. For this reason, an avalanche breakdown occurs not in active portion 21, but in a position Q shown in FIG. 15. Because an avalanche current flows mainly in voltage withstanding structure portion 22 compared with active portion 21, the avalanche current is concentrated in voltage withstanding structure portion 22 so that the withstand voltage is lowered.

As a measure to solve this problem, there is a method of thickening oxide film 11 on the sidewall of each trench. For example, to form oxide film 11 having a thickness of 5000 Å or more, it is necessary to control a gas flow while the temperature is kept at 1000° C. or higher for a long time during an oxidizing process. The processing process per se is difficult. Moreover, when a high reverse bias voltage is applied to the TMBS diode, isoelectric lines are concentrated in oxide film 11 having a low dielectric constant. As a result, the aforementioned good RESURF effect cannot be obtained, so that a withstand voltage increasing and leakage current reducing effect which is a merit of the TMBS diode is lowered.

Moreover, when p-type guard ring layer 5 is in contact with anode electrode 3, the following problem arises. When the value of the forward bias voltage at the time of on operation becomes higher than the content potential of a pn junction formed between p-type guard ring layer 5 and n-type drift layer 2, a forward bias is applied to the pn junction so that minority carriers (positive holes) are injected into n-type drift layer 2. For this reason, when the on operation is switched off, the stored minority carriers are flushed out so that the reverse recovery time becomes very large. Accordingly, the p-type guard ring being in contact with n-type drift layer 2 serves as a factor of disturbing high-speed operation which is one of merits of the TMBS diode.

In addition, there is a problem in the conventional method of processing the lengthwise end portion of each active portion trench 12. When the terminating process shown in FIG. 16A is applied to the TMBS diode, electric field intensity is concentrated in a position M shown in FIG. 16A at the time of application of a reverse bias. That is, because the end portion of each active portion trench 12 is curved with a certain curvature radius so that the shape of the end portion is reflected in isoelectric lines spread toward the outside of the doughnut shape, the isoelectric lines are curved. As a result, because electric field intensity is proportional to a spatial gradient of electrostatic potential, electric field intensity in the outside of active portion trench 12 increases compared with that in the inside of active portion trench 12 shaped like a linear stripe. Electric field intensity is maximized in the position M farthest from adjacent trenches inclusively of end portion trench 7. Accordingly, not only does avalanche occur easily in the position M but also the leakage current increases in the position M because of a well-known Schottky barrier reducing phenomenon. In addition, in the method shown in FIG. 16B, the end portion of each active portion trench 12 is terminated with a semi-circular shape having the width of the trench as its diameter but the curvature radius of the semi-circular shape is very small. As a result, electric field intensity increases remarkably largely in the end portion of the trench as described above. In addition, stress is generated among the semiconductor layer (n-type drift layer 2) around active portion trenches 12, oxide film 11 formed on the sidewall of each active portion trench 12 by thermal oxidation or the like, and polysilicon 13 embedded in the inside of oxide film 11 (see FIG. 15). Because this stress increases according to decrease in curvature radius of each trench end portion, cracks 14 are frequently generated in mesa region 18 as shown in FIG. 16B.

The present invention is directed to overcoming or at least reducing the effects of one or more of the problems set forth above.

SUMMARY OF THE INVENTION

The invention provides a semiconductor device which can be produced easily while electric field intensity concentrated in an outer circumferential side bottom of each trench formed in an end portion of an active portion and in which a low leakage current and a high withstand voltage are obtained so that injection of minority carriers is suppressed.

The invention provides a semiconductor device including: a cathode layer made of a first conductivity type semiconductor substrate; a drift layer provided on one principal surface of the cathode layer and made of a first conductivity type semiconductor substrate lower in concentration than the cathode layer; at least one first trench and an end portion trench provided in an upper surface of the drift layer so that the first trench is surrounded by the end portion trench; a first conductor embedded in each of the first trench and the end portion trench through an insulating film; an anode electrode provided on the upper surface of the drift layer so that the anode electrode is in contact with the first conductor, and that a Schottky barrier junction is formed between the anode electrode and the drift layer; and a cathode electrode provided on the other principal surface of the cathode layer, wherein: an outer circumferential side end portion of the anode electrode is in contact with the first conductor of the end portion trench; a field plate is provided separately from the anode electrode; a second trench is provided separately from the end portion trench so that the end portion trench is surrounded by the second trench; a second conductor is embedded in the second trench through an insulating film; and the field plate is in contact with the second conductor and with the drift layer in a mesa region between the end portion trench and the second trench.

The structure of the semiconductor device in the invention has the following characteristics with respect to the active portion and the voltage withstanding structure portion of the TMBS diode:

(1) As for the end portion trench provided so as to surround at least one first trench formed in the active portion, an end portion of the anode electrode is in contact with a conductor formed inside the end portion trench.
(2) A second trench is formed on the outer circumferential side of the end portion trench so as to be separated from the end portion trench and surround the end portion trench.
(3) A field plate separated from the anode electrode is formed in the outer circumferential portion of the anode electrode so as to be in contact with part of the surface of the mesa region of the n-type drift layer between the end portion trench and the second trench and with the conductor formed in the inside of the second trench.

With the aforementioned configuration, when a reverse bias voltage is applied to the junction between the anode electrode and the n-type drift layer, electric potential in the vicinity of the second trench becomes higher than that of the anode electrode. On this occasion, electric potential in a place of the mesa region between the end portion trench and the second trench where the surface of the n-type drift layer is in contact with the field plate becomes equal to that of the conductor in the inside of the second trench. As a result, the depletion layer spread from the Schottky barrier junction between the anode electrode and the n-type drift layer is pulled by the electric potential of the field plate. In this manner, in the vicinity of the surface of the voltage withstanding structure portion, the depletion layer can be easily spread in a direction parallel to the surface, so that electric field intensity in the vicinity of the bottom of the end portion trench can be relaxed.

Preferred means with respect to the invention will be described. It is preferable that a distance W1 from an outer circumferential side sidewall of the end portion trench to an inner circumferential side end portion (hereinafter referred to as position P) of a region where the field plate and the drift layer are in contact with each other is smaller than a distance W2 from the position P to an inner circumferential side end portion of the second trench.

In this case, because the distance from the outer circumferential side end portion of the active end portion trench to the position P is short, the depletion layer spread at the time of application of a reverse bias is more strongly pulled by the electric potential of the field plate. For this reason, because the depletion layer can be spread toward the second trench by a low reverse bias voltage, the effect of relaxing electric field intensity in the vicinity of the trench bottom of the active end portion becomes strong. As a result, an avalanche current can be prevented from being concentrated in the voltage withstanding structure portion.

It is further preferable that a width of the end portion trench is larger than a width of the first trench.

It is desirable that the width of the first trench which is an ineffective region at the time of current conduction is reduced as much as possible. On the other hand, in the end portion trench, the end portion of the anode electrode must be terminated in the region of a conductor such as polysilicon embedded in the inside of the end portion trench. Accordingly, when the width of the end portion trench is set to be larger than the width of the first trench, the anode electrode can be terminated stably.

It is further preferable that a third trench is disposed between the first trench and the end portion trench so that a linear portion of the third trench is shorter than that of the first trench, that both ends of the third trench are curved with a smaller radius than the curvature radius of the end portion trench, and that the both ends of the third trench are connected to outermost one of the first trenches.

In this case, because the lengthwise end portion of the first trench sidewall formed in the active portion is generally curved relative to the upper surface of the chip and the curvature radius thereof is small, electric field intensity increases when the depletion layer is spread at the time of application of a reverse bias. Accordingly, with the aforementioned configuration, the lengthwise end portion of the first trench is not present so that the aforementioned concentration of electric field intensity does not occur.

It is further preferable that each of first trenches formed in the active portion is shaped like a doughnut on the upper surface of the drift layer; and a geometric center of gravity of the first trenches is located inside a doughnut-shaped trench which is formed in the innermost circumference of the anode electrode and which has the smallest diameter among the first trenches.

In this case, each of the first trenches formed in the active portion is shaped like a doughnut. For this reason, there is no end portion in the lengthwise direction of the sidewall in each of the first trenches. Moreover, the position of a geometric center of gravity of the doughnut-shaped first trenches in the chip surface is provided so as to be located inside the innermost circumferential first trench substantially formed in the center of the active portion. Accordingly, because there is no concentration of electric field intensity in the vicinity of the lengthwise end portion as described above, lowering of the withstand voltage caused by the concentration of electric field intensity can be prevented.

It is further preferable that a second conductivity type floating layer formed on the upper surface of the drift layer so as to be connected to both or either of the end portion trench and the second trench and connected to the field plate is disposed so as to be separated from the anode electrode; and the depth of the floating layer from the upper surface of the drift layer is larger than the depths of both of the end portion trench and the second trench or the depth of either of the end portion trench and the second trench.

In this case, because the depletion layer spread at the time of application of a reverse bias can reach the floating layer earlier than the second trench, the effect of pulling the depletion layer to the outer circumferential side becomes strong. As a result, electric field intensity in the vicinity of the bottoms of the end portion trench and the second trench can be relaxed more. Moreover, because this p-type floating layer is not in contact with the anode electrode, positive holes which are minority carriers are not injected into the drift layer so that the electric field intensity can be relaxed. In addition, because the junction of the floating layer becomes deeper than the first or second trench so that the depletion layer is spread from the pn junction of the floating layer, the depletion layer is little spread to the trench bottom located in a position shallower than the junction depth. For this reason, electric field intensity in the trench bottom little increases so that the withstand voltage can be determined substantially based on only the structure of the active region.

It is further preferable that the floating layer is in contact with the second trench.

In this manner, the depletion layer can be more easily spread to the outer circumference of the chip. As a result, the withstand voltage value inclusive of the voltage withstanding structure portion can be made higher than the withstand voltage value of only the active portion.

It is further preferable that a first conductivity type surface layer having a higher concentration than the concentration of the drift layer and being shallower than both or either of the end portion trench and the second trench is formed on a surface of the drift layer held between the end portion trench and the second trench. It is further preferable that the maximum concentration of the surface layer is not lower than a value exhibited by the drift layer and not higher than 10 times as much as the value exhibited by the drift layer.

When external electric charge enters the voltage withstanding structure portion, the surface layer prevents the surface of the mesa region from being electrostatically charged so that formation of hole channels or change in electric field intensity distribution can be avoided to thereby keep the withstand voltage or the leakage current stable.

As described above, in accordance with the invention, it is possible to provide a semiconductor device which can be produced easily while electric field intensity concentrated in an outer circumferential side bottom of each trench formed in an end portion of an active portion is relaxed and in which a low leakage current and a high withstand voltage are obtained so that injection of minority carriers is suppressed.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Although description will be made on the assumption that an n type is used as a first conductivity type and a p type is used as a second conductivity type, the invention can operate likewise even when the n type and the p type are replaced by each other. Although an expression "element" or "chip" will be used for a TMBS diode which is a semiconductor device in each of the following embodiments, the expression "element" or "chip" means the same thing.

Embodiment 1

Figure 1:
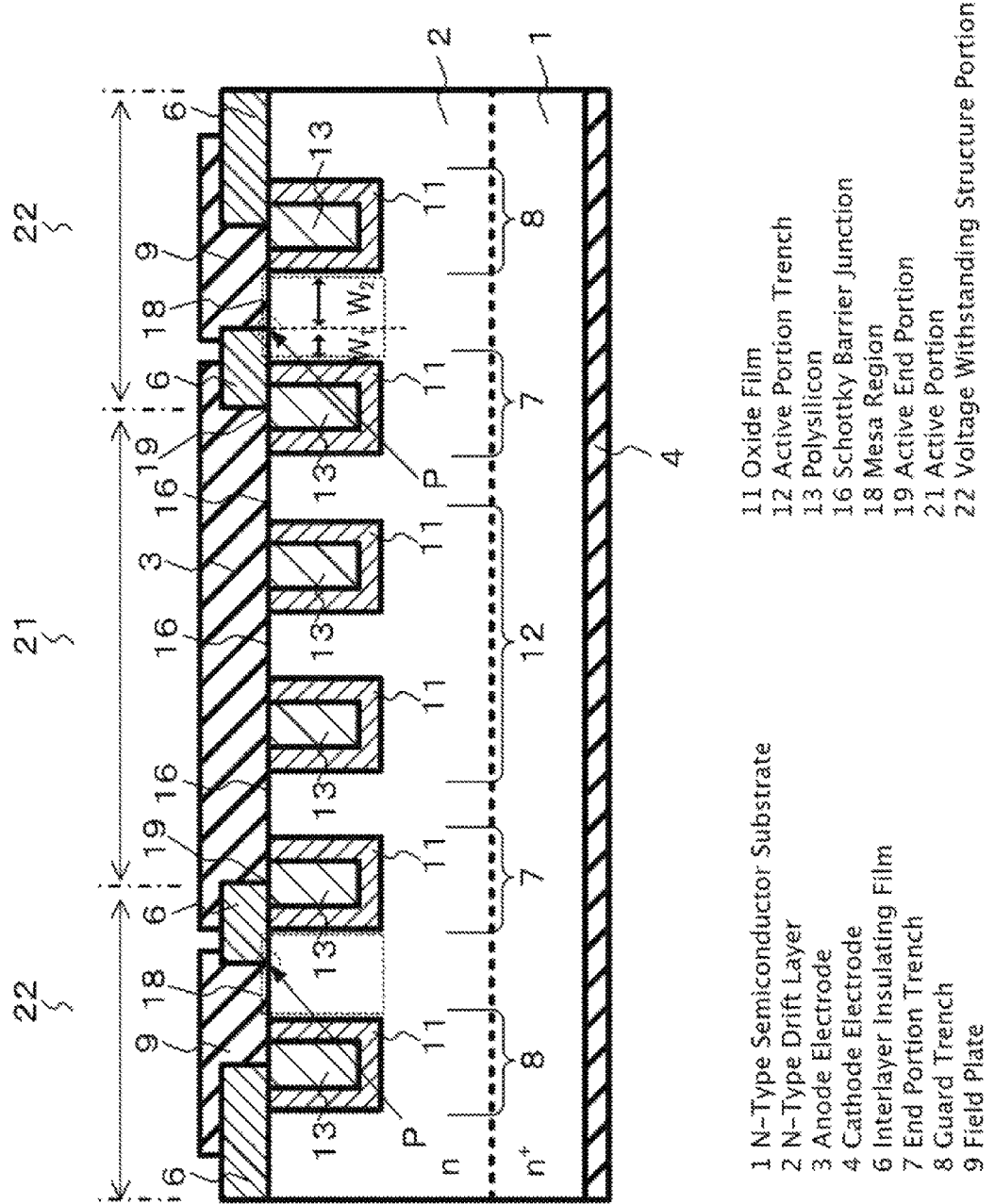
FIG. 1 is a sectional view showing important part of a semiconductor device according to an embodiment of the invention.

A TMBS diode according to Embodiment 1 of the invention will be described with reference to FIG. 1.

N-type drift layer 2 lower in concentration than n-type semiconductor substrate 1 is formed on an upper surface of n-type semiconductor substrate 1 to keep the withstand voltage of the element high. Active portion 21, serving as a main path for passing an electric current, and voltage withstanding structure portion 22 are formed on an upper surface of n-type drift layer 2. Voltage withstanding structure portion 22 is a region for relaxing electric field intensity concentrated in an outer circumferential side of active portion 21 when a reverse bias is applied to the element so that a depletion layer is spread toward an outer circumferential portion of the chip. Trenches (hereinafter referred to as active portion trenches 12) are disposed at regular intervals in an upper surface of the chip in active portion 21. Oxide film 11 is formed on a sidewall of each active portion trench 12. Conductive polysilicon 13 is further embedded in the inside of oxide film 11. Oxide film 11 electrically insulates n-type drift layer 2 and polysilicon 13 from each other. Anode electrode 3 is formed on an upper surface of active portion 21 so that a Schottky barrier junction is formed between anode electrode 3 and n-type drift layer 2. On this occasion, it is preferable that the width of a mesa portion between adjacent active portion trenches 12 on both sides of Schottky barrier junction 16 is smaller than twice the width Wbi of the built-in depletion layer spread from Schottky barrier junction 16 and sidewalls of adjacent active portion trenches 12 to n-type drift layer 2 in a thermal equilibrium state. In this manner, the depletion layer spread from Schottky barrier junction 16 and sidewalls of adjacent active portion trenches 12 on the both sides of Schottky barrier junction 16 can be pinched off immediately (i.e., depletion layers spread from different directions can be combined and spread as one depletion layer) when the reverse bias is applied to the TMBS diode. As a result, because electric field intensity of Schottky barrier junction 16 can be reduced, there is minimal occurrence of Schottky barrier height reducing phenomenon so that increase in leakage current can be suppressed. Anode electrode 3 is also in contact with polysilicon 13 so that anode electrode 3 is in ohmic contact with polysilicon 13. More strictly defining active end portion 19, active end portion 19 is an end portion of a region where anode electrode 3 is in contact with n-type drift layer 2 or polysilicon 13. Active end portion 19 in Embodiment 1 of the invention has a structure in which active end portion 19 is always terminated inside of polysilicon 13 so that active end portion 19 is not in direct contact with n-type drift layer 2. In this manner, electric field intensity in n-type drift layer 2 near active end portion 19 can be prevented from increasing locally when the reverse bias is applied to the TMBS diode. The trench which is formed in active end portion 19 and in which the anode electrode is terminated is referred to as end portion trench 7. Interlayer insulating film 6 is formed on an upper portion of end portion trench 7 so as to extend toward the outer circumference of the chip. Anode electrode 3 extends toward the outer circumference of the chip on an upper surface of interlayer insulating film 6 and is terminated on the upper surface of interlayer insulating film 6. On the other hand, in voltage withstanding structure portion 22 provided on the chip outer circumferential side of end portion trench 7, guard trench 8 is formed so as to be separated from end portion trench 7. Similarly to each active portion trench 12, conductive polysilicon 13 is embedded into guard trench 8 through an oxide film formed on a sidewall of guard trench 8. Conductive field plate 9 is further formed so as to be in contact with polysilicon 13 embedded in guard trench 8. Field plate 9 is connected not only to polysilicon 13 inside guard trench 8 but also to mesa region 18 of n-type drift layer 2 between end portion trench 7 and guard trench 8 at an opening portion of an upper surface of mesa region 18.

With the aforementioned configuration, when a reverse bias voltage is applied to the junction of anode electrode 3 and n-type drift layer 2, electric potential in the vicinity of guard trench 8 becomes higher than that of anode electrode 3. On this occasion, electric potential at a place where n-type drift layer 2 is in contact with field plate 9 in mesa region 18 between end portion trench 7 and guard trench 8 becomes equal to that of conductive polysilicon 13 inside guard trench 8. As a result, the depletion layer spread from Schottky barrier junction 16 between anode electrode 3 and n-type drift layer 2 is pulled by the electric potential of field plate 9. In this manner, also in voltage withstanding structure portion 22, the depletion layer is easily spread toward the outer circumference of the chip, so that electric field intensity in the vicinity of the bottom of end portion trench 7 is relaxed.

It is preferable that the distance W1 from an outer circumferential side sidewall of end portion trench 7 to a chip inner circumferential side end portion (position P in FIG. 1) of a region where field plate 9 and n-type drift layer 2 are in contact with each other is smaller than the distance W2 from the position P to a chip inner circumferential side end portion of guard trench 8. In this case, because the distance from the outer circumferential side sidewall of end portion trench 7 to the position P is reduced, the depletion layer spread at the time of application of the reverse bias is pulled more strongly by the electric potential of field plate 9. Accordingly, because the depletion layer can be spread toward guard trench 8 by a low reverse bias voltage, the effect of relaxing electric field intensity in the vicinity of the bottom of end portion trench 7 becomes strong. As a result, an avalanche current can be prevented from being concentrated in voltage withstanding structure portion 22. Incidentally, the relation between W1 and W2 will be described later.

A manufacturing method according to Embodiment 1 of the invention will be described next. In the following description, a TMBS diode having a rated voltage of 100V is taken as an example.

A mirror finished surface of a 500 μm-thick n-type semiconductor substrate 1 containing a concentration of $1\times10^{19}/cm^3$ or more of arsenic and formed by a CZ method is regarded as an upper surface. N-type drift layer 2 containing a concentration of $4\times10^{15}/cm^3$ of phosphorus is deposited on the upper surface of n-type semiconductor substrate 1 by an epitaxial growth method. Next, a 4000 Å-thick thermal oxide film is grown on the upper surface of n-type drift layer 2, then patterning or etching (mainly anisotropic dry etching) is applied to the thermal oxide film by photolithography to thereby form an oxide film mask for trench etching. After this, silicon is etched from opening portions of the oxide film mask by anisotropic etching, thereby to form trenches. Next, a 3000 Å-thick thermal oxide film is formed on a sidewall of each trench and then polysilicon doped with phosphorus is deposited by a chemical vapor deposition (CVD) method. The polysilicon is etched so that polysilicon 13 remains only inside each trench. Then, an interlayer insulating film such as BPSG (Boron Phosphorus Silicon Glass), HTO, etc. is deposited by a CVD method or the like. In a region where n-type drift layer 2 is connected to anode electrode 3 or field plate 9, the interlayer insulating film is opened by patterning or etching. A metal which serves as anode electrode 3 is formed by a sputtering method or a vapor deposition method. The metal is selected suitably in accordance with the rated voltage in consideration of a barrier height determined by a Schottky barrier junction of a well-known metal (such as molybdenum, titanium, tungsten, platinum or palladium) and a semiconductor (such as silicon, silicon carbide (SiC) or gallium nitride (GaN)). In Embodiment 1, nickel is used. The anode electrode 3 is patterned or etched. A polyimide film, a silicon nitride film or the like is further deposited and patterned or etched to thereby form a passivation film not shown. Then, the lower surface of n-type semiconductor substrate 1 is background so that the thickness of what remains of n-type drift layer 2 and n-type semiconductor substrate 1 is 30 μm. Then cathode electrode 4 is formed on the ground surface by a sputtering or vapor deposition method. Finally, the wafer is diced and cut into individual chips by a diamond cutter or the like. Incidentally, the sequence of the aforementioned steps may be partially changed as long as the TMBS diode according to the embodiment of the invention can be produced.

Here, polysilicon 13 inside each trench is used for equalizing the electric potential of the inside of each trench to that of anode electrode 3. Therefore, any material may be used as the material embedded into each trench as long as the material exhibits conductivity. For example, the material may be aluminum or an alloy of aluminum and silicon, it may be the same metal as that of anode electrode 3 or it may be a high-melting point metal such as platinum which is higher in melting point than silicon. Although the producing method has been described on the assumption that the rated voltage is 100V, any other rated voltage (such as 30V, 50V or 200V) may be used. In this case, the thickness of n-type drift layer 2, the doping concentration thereof, the metal for anode electrode 3, etc. may be adjusted or selected suitably in accordance with necessity.

Electric potential distributions and sectional electric field intensity distributions in the TMBS diode according to Embodiment 1 of the invention at the time of application of a reverse bias voltage of 100V now will be compared with those in the TMBS diode according to the background art.

Figure 5A:
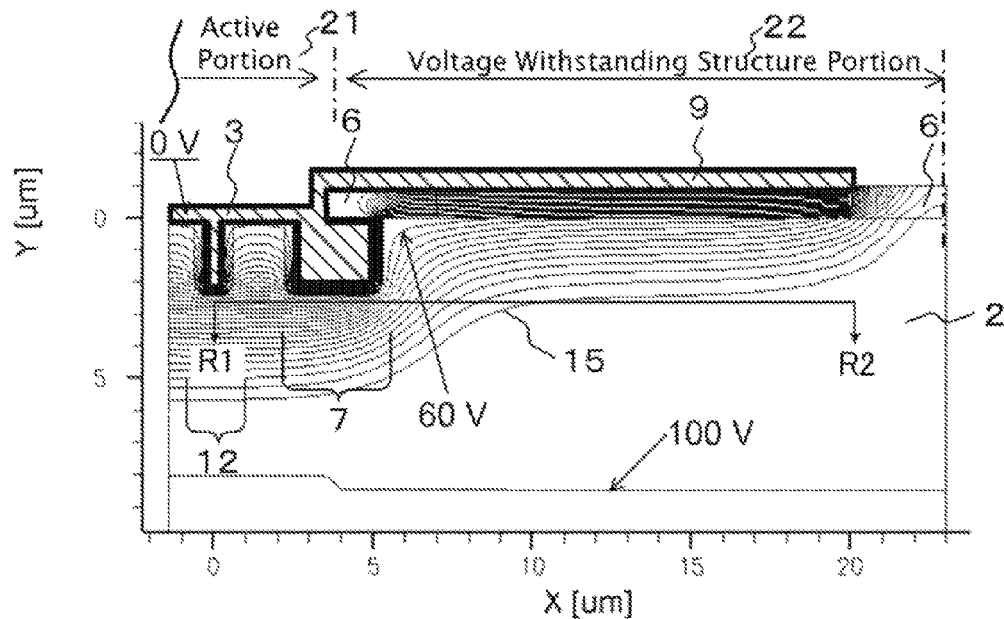
FIG. 5A is a sectional view showing characteristic of important part of a semiconductor device according to the background art.
Figure 5B:
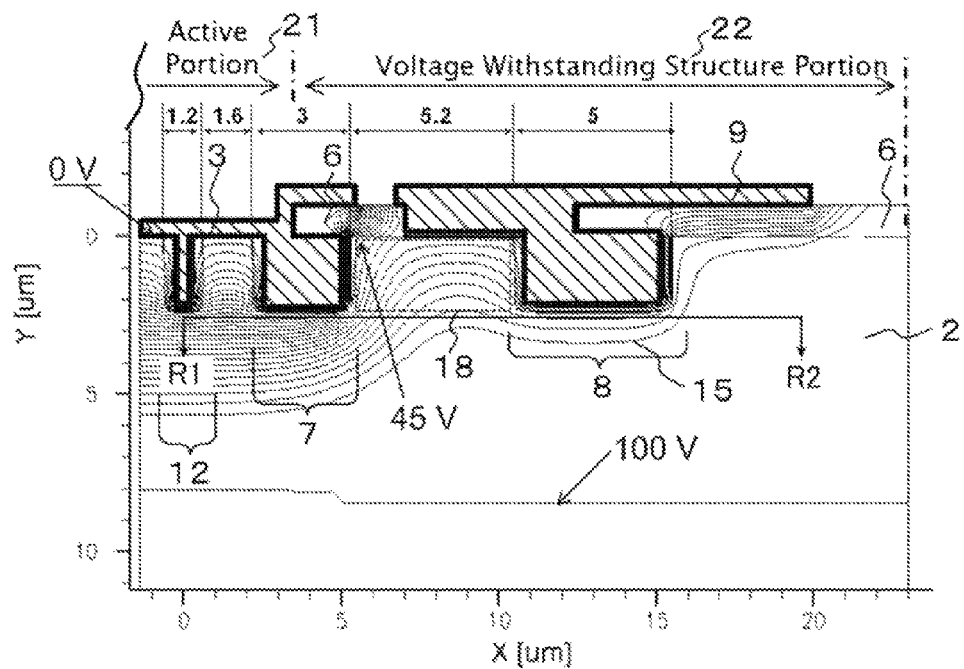
FIG. 5B is a sectional view showing characteristic of important part of a semiconductor device according to an embodiment of the invention.

FIGS. 5A and 5B are views each showing a distribution of isoelectric lines 15 (or an electrostatic potential distribution) in a section taken vertically to a chip surface when a reverse bias voltage of 100V is applied to the TMBS diode. FIG. 5A shows a TMBS diode according to the background art. FIG. 5B shows a TMBS diode according to Embodiment 1. Particularly on an upper surface of the chip shown in FIG. 5B, finished dimensions (which are dimensions after completion of a process and which are dimensions in consideration of etched portions from dimensions in a photo mask) of active portion trenches 12, end portion trench 7, guard trench 8, interlayer insulating film 6, anode electrode 3 and field plate 9 in the chip surface are written. The structure shown in FIG. 5A is characterized in that anode electrode 3 per se connected to polysilicon 13 inside end portion trench 7 has a function of field plate 9 also in voltage withstanding structure portion 22. That is, the electric potential of field plate 9 in voltage withstanding structure portion 22 is always equal to that of anode electrode 3. As a result, it is found that isoelectric lines 15 are distributed densely on the outer circumferential side of the bottom of end portion trench 7 but isoelectric lines 15 are pulled toward the outer circumference of the chip along the lateral length of field plate 9. This relaxes the concentration state of isoelectric lines 15 in the vicinity of the bottom of end portion trench 7. On the other hand, isoelectric lines 15 of 0V to 60V enter the inside of interlayer insulating film 6. This is because the relative dielectric constant (3.9) of interlayer insulating film 6 made of silicon oxide is smaller than that (11.9) of silicon. Accordingly, even when field plate 9 is made sufficiently long as shown in FIG. 5A (about 16 μm in FIG. 5A), relaxation of the concentration state of isoelectric lines 15 on the outer circumferential side of the bottom of end portion trench 7 is still insufficient. On the other hand, in the structure of Embodiment 1 shown in FIG. 5B, the concentration state of isoelectric lines 15 on the outer circumferential side of the bottom of end portion trench 7 is relaxed compared with the conventional structure shown in FIG. 5A. The electric potential in the vicinity of the bottom of end portion trench 7 is 45V which is smaller by 15V than that in the conventional structure. When isoelectric lines 15 in a region (mesa region 18) of n-type drift layer 2 between end portion trench 7 and guard trench 8 are viewed, it is found that isoelectric lines 15 are curved toward the bottom (lower surface) of guard trench 8. This is because field plate 9 connected to the inside of guard trench 8 is also connected to mesa region 18 so that the surface electric potential of mesa region 18 is fixed to the electric potential of the inside of guard trench 8. That is, guard trench 8 pulls the electric potential of mesa region 18 through field plate 9 to thereby relax the concentration state of isoelectric lines 15 in the bottom of end portion trench 7.

Figure 6:
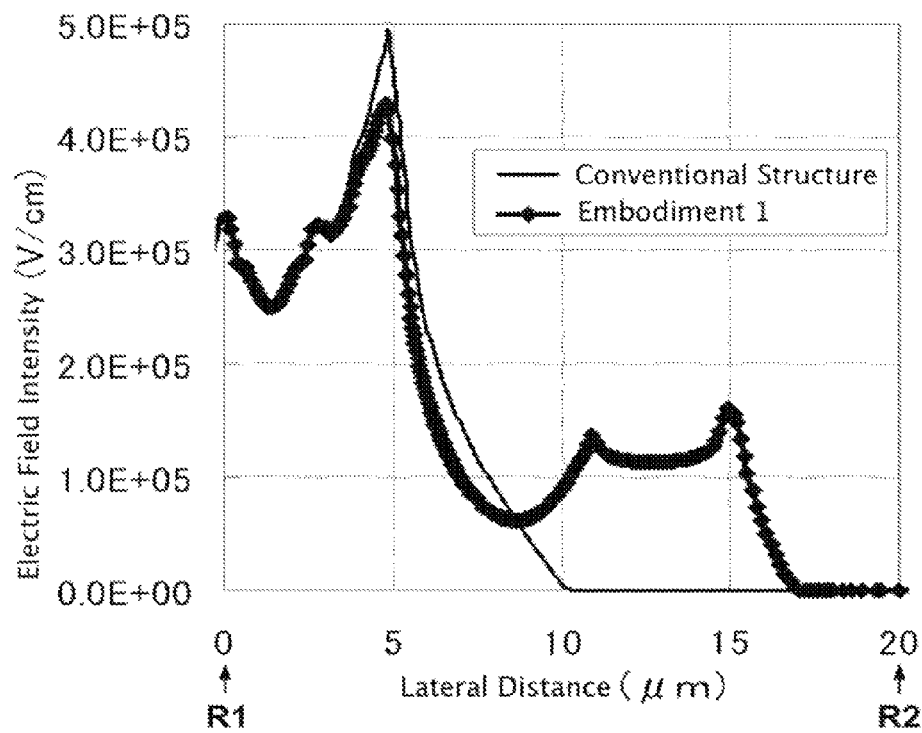
FIG. 6 is a characteristic graph showing electric characteristic in a depth direction of important part of a semiconductor device according to an embodiment of the invention.

The degree of relaxation of isoelectric lines 15 is found well when the electric field intensity distribution is viewed. FIG. 6 is a graph showing an electric field intensity distribution along a cutting-plane line when the inside in each of FIGS. 5A and 5B is cut along the line R1-R2. The thick-line curve with circular markers shows Embodiment 1 whereas the thin-line curve shows the conventional structure. Electric field intensity in a position at a lateral distance of 5 μm, that is, electric field intensity of the bottom of end portion trench 7 on the outer circumferential side of the chip exhibits the maximum value. Because the maximum electric field intensity in Embodiment 1 is $4.3 \times 10^5$ V/cm, it is found that the maximum electric field intensity is reduced by about 14% compared with the value in the conventional field plate structure. The impact ionization rate due to avalanche is exquisitely sensitive to electric field intensity. When, for example, electric field intensity increases by about 20%, the impact ionization rate increases by a range of five times to ten times. Accordingly, the aforementioned reduction in maximum electric field intensity has a very large effect in preventing occurrence of avalanche due to voltage withstanding structure portion 22.

Here, it is preferable that the width of end portion trench 7 or guard trench 8 is larger than the width of each active portion trench 12 as shown in FIG. 5B. At the time of conduction of a forward current, active portion trench 12 per se is an ineffective region because it does not serve as a current path. Accordingly, it is preferable that the width of active portion trench 12 is formed as the smallest width allowed by a process design rule. On the other hand, with respect to end portion trench 7, an end portion (active end portion 19) of anode electrode 3 needs to be terminated in an upper portion of polysilicon 13 embedded into end portion trench 7, as shown in FIG. 1. In addition, with respect to guard trench 8, field plate 9 needs to be terminated in the upper portion of polysilicon 13 embedded in guard trench 8. Accordingly, the width of end portion trench 7 or guard trench 8 needs to be kept considerably large. When the width of end portion trench 7 or guard trench 8 is larger than the width of active portion trench 12, the end portion of anode electrode 3 or field plate 9 can be terminated stably. Accordingly, it is preferable that the width of end portion trench 7 or guard trench 8 is larger than the width of active portion trench 12.

Figure 8A:
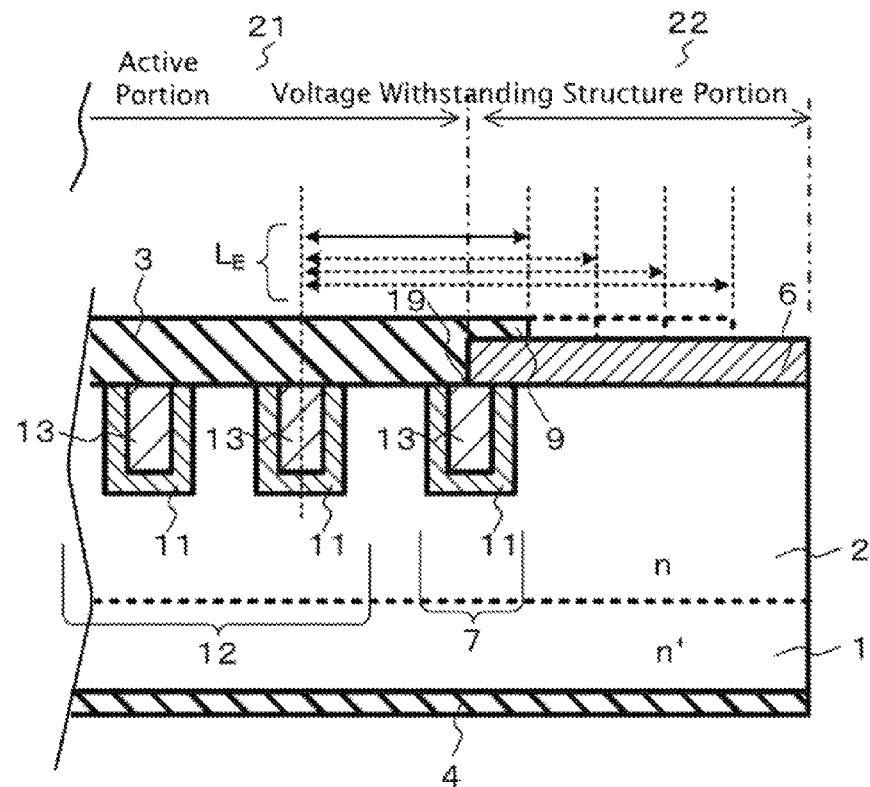
FIG. 8A is a sectional view showing important part of a semiconductor device according to an embodiment of the background art.
Figure 8B:
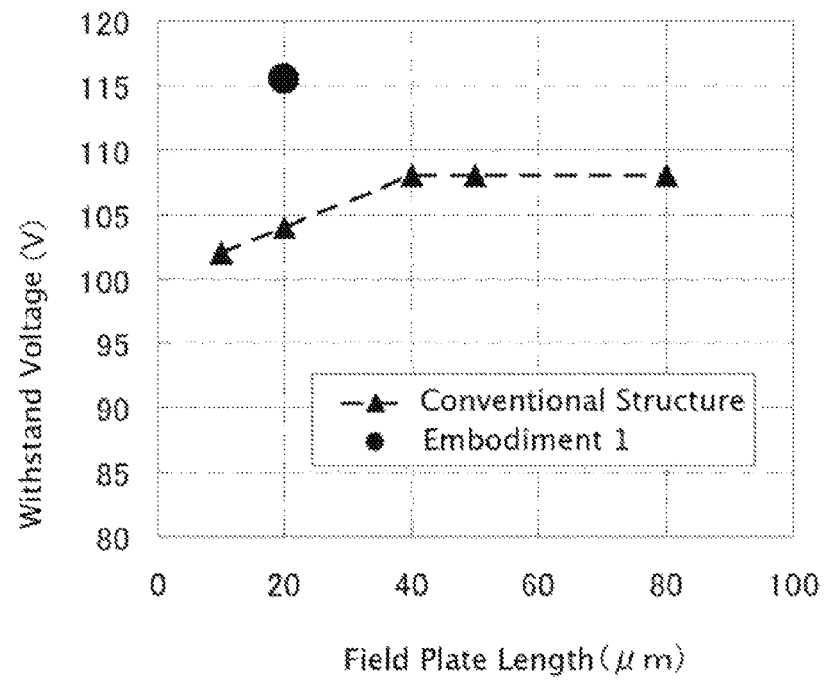
FIG. 8B is a characteristic relational graph showing electric characteristics of semiconductor devices according to an embodiment of the invention and the background art.

How excellent the structure according to Embodiment 1 of the invention is in view of keeping of a withstand voltage compared with the case where the conventional field plate structure is used as a voltage withstanding structure of a TMBS diode will be described next. FIG. 8A is a view showing a section in a range of active portion 21 to voltage withstanding structure portion 22 in the case where the conventional field plate structure is used as a voltage withstanding structure of a TMBS diode. As described above, when voltage withstanding structure portion 22 is formed in the TMBS diode without use of any p-type guard ring layer 5, a portion of active end portion 19 of anode electrode 3 needs to be terminated in an inner region of conductive polysilicon 13 in end portion trench 7. Further, the length of field plate 9 needs to be extended to the outer circumferential side of the chip in order to relax electric field intensity on the chip outer circumferential side of the bottom of end portion trench 7. Therefore, let $L_E$ be the length from the center of active portion trench 12 most adjacent to end portion trench 7 to the chip outer circumferential side end portion of field plate 9. FIG. 8B is a graph showing the withstand voltage exhibited by the conventional field plate structure when $L_E$ is changed, in comparison with the withstand voltage of the structure according to Embodiment 1. When $L_E$ in the conventional field plate structure is set to be long, the withstand voltage value is saturated at 108V when $L_E$ is not smaller than 40 μm, as shown in FIG. 8B. This is because isoelectric lines are absorbed to interlayer insulating film 6 so that electric field intensity is not relaxed even when $L_E$ is set to be not smaller than 40 μm. Accordingly, $L_E$ needs to be 40 μm at the minimum. On the other hand, in Embodiment 1 in which $L_E$ is set as 20 μm, a withstand voltage of 115V is exhibited and the withstand voltage can be increased by 6% compared with $L_E > 40$ μm in the conventional field plate structure. Accordingly, the withstand voltage can be kept high even when the length of voltage withstanding structure portion 22 is reduced remarkably.

Figure 9:
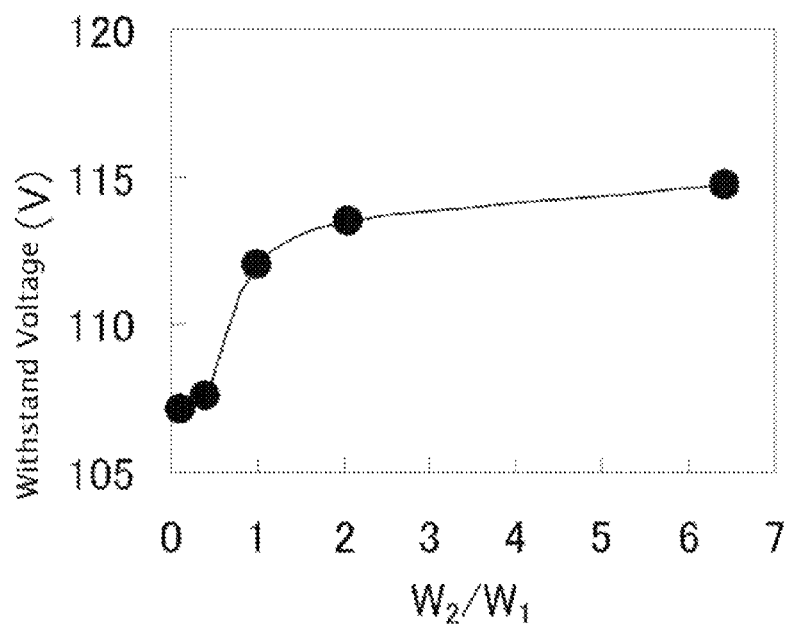
FIG. 9 is a characteristic relational graph of a semiconductor device according to an embodiment of the invention.

A point of operation and effect in Embodiment 1 of the invention will be described next. The point in Embodiment 1 of the invention is as follows. That is, as described above, a surface of mesa region 18 between end portion trench 7 and guard trench 8 is connected to field plate 9 having the same electric potential as that of conductive polysilicon 13 embedded in guard trench 8 so that the electric potential of mesa region 18 is fixed to guard trench 8. Let W1 be the distance from active end portion 19 to the chip inner circumferential side end portion (hereinafter referred to as position P) of a region where field plate 9 and n-type drift layer 2 are in contact with each other. Let W2 be the distance from the position P to the chip inner circumferential side end portion of guard trench 8. (Both W1 and W2 are written in FIG. 1). That is, W1 is the length of a region which is part of a surface of mesa region 18 and which is covered with interlayer insulating film 6. On the other hand, W2 is the length of a region which is part of the surface of mesa region 18 and in which n-type drift layer 2 is in contact with field plate 9. On this occasion, the relative difference between W1 and W2 is important. FIG. 9 is a graph showing the relation between the ratio of W2 to W1 (W2/W1) and the withstand voltage of the element. W1 is set to be 2.0 μm. When W2 is smaller than W1, the withstand voltage becomes rapidly smaller than the value (115V) shown in FIG. 8B. The reason is as follows. When the length W2 of the region where field plate 9 and mesa region 18 are in contact with each other is shortened, the effect of guard trench 8 pulling the electric potential of mesa region 18 through field plate 9 is weakened. As a result, isoelectric lines 15 exit from interlayer insulating film 6 to the outside, so that electric field intensity in the bottom of end portion trench 7 increases. Accordingly, it is preferable that W2 is larger than W1. Moreover, the withstand voltage increases to 119V when W2 is larger than W1, and the withstand voltage is substantially saturated when W2 is not smaller than twice as large as W1. That is, when the length of W2 is twice as large as length of W1, the effect of pulling the electric potential of the mesa region 18 is maximized and stabilized. Accordingly, it is further preferable that W2 is not smaller than twice as large as W1.

Incidentally, in a practical design, mesa region 18 held between end portion trench 7 and guard trench 8 is disposed mainly annularly in a surface of the chip. On this occasion, a portion of W1>W2 may be allowed to be slightly present as part of annular mesa region 18, but the practical withstand voltage has to be reduced largely from the value at W1<W2 as described above.

When the electric potential of mesa region 18 between end portion trench 7 and guard trench 8 is provided as a floating electric potential without connection of guard trench 8 to n-type drift layer 2, the following problem occurs. When the electric potential of mesa region 18 is provided as a floating electric potential, guard trench 8 cannot pull the isoelectric lines of the mesa portion because isoelectric lines 15 exit from oxide film 11 and interlayer insulating film 6 formed on a sidewall of end portion trench 7 to the outside when the depletion layer is spread at the time of application of a reverse bias. As a result, there is substantially the same state as the state where guard trench 8 is absent, so that electric field intensity increases locally in the bottom of end portion trench 7. As a result, avalanche occurs at a low voltage value, so that the withstand voltage becomes lower than the withstand voltage value of only active portion 21. When guard trench 8 which should have a floating electric potential is electrically charged for some reason at the time of production of the trench, this causes lowering of the withstand voltage likewise.

Embodiment 2

Figure 2:
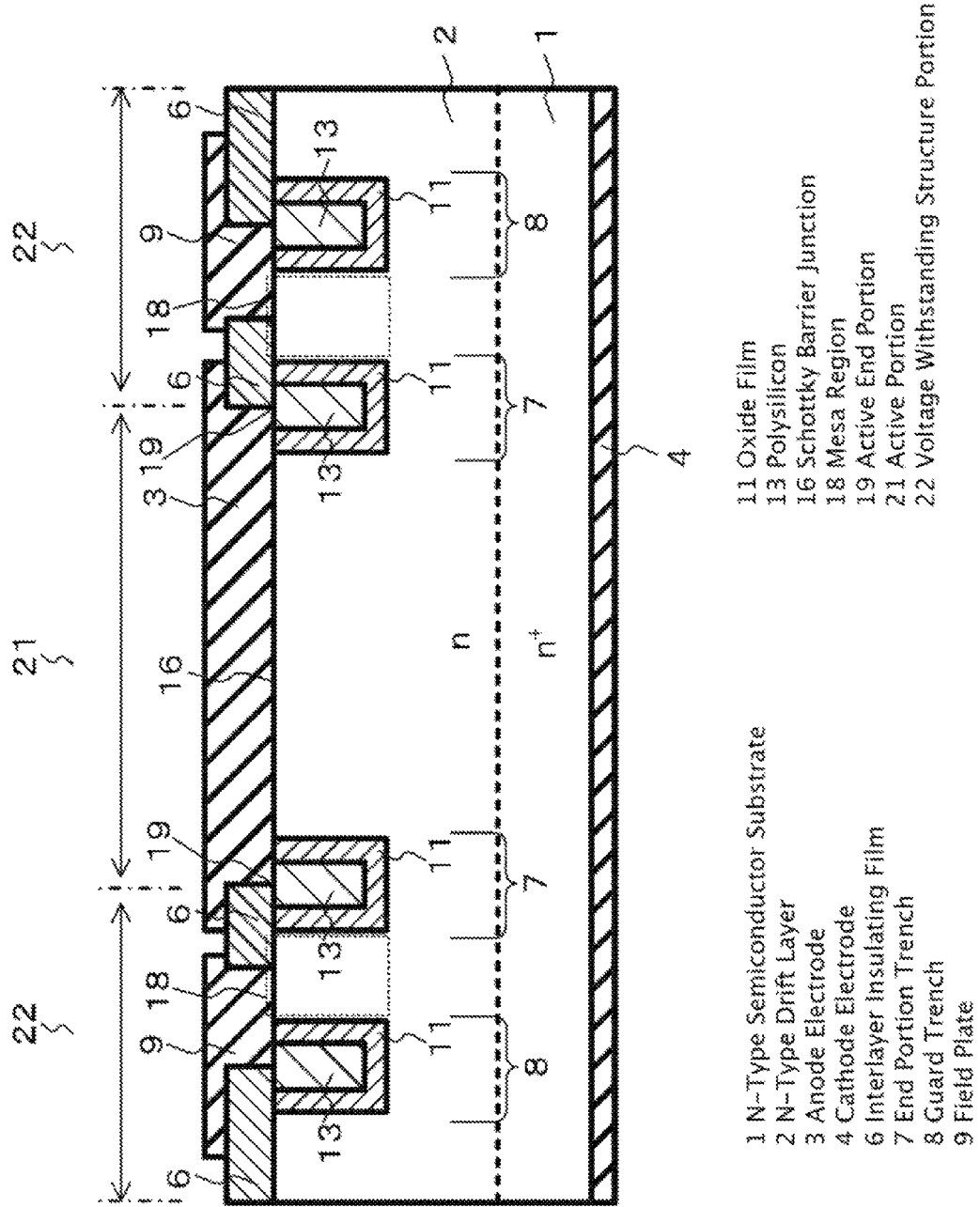
FIG. 2 is a sectional view showing important part of a semiconductor device according to an embodiment of the invention.

FIG. 2 is a view showing a section of a TMBS diode according to Embodiment 2 of the invention. The point of difference of Embodiment 2 from Embodiment 1 lies in that active portion trenches 12 are not formed, but only end portion trench 7 is formed in active portion 21. Each active portion trench 12 in the TMBS diode is an ineffective region at the time of current conduction because active portion trench 12 per se does not serve as a current path. For example, when the rated current of the TMBS diode is set to be small (e.g., 1 A or less) for small current capacity purposes, the area of active portion 21 becomes so small that the percentage of the area occupied by active portion trenches 12 which are ineffective regions may increase. In this case, the withstand voltage can be kept sufficient and the forward voltage drop can be reduced even if trenches are not formed but end portion trench 7 is formed in active portion 21 as shown in Embodiment 2.

Embodiment 3

Figure 3:
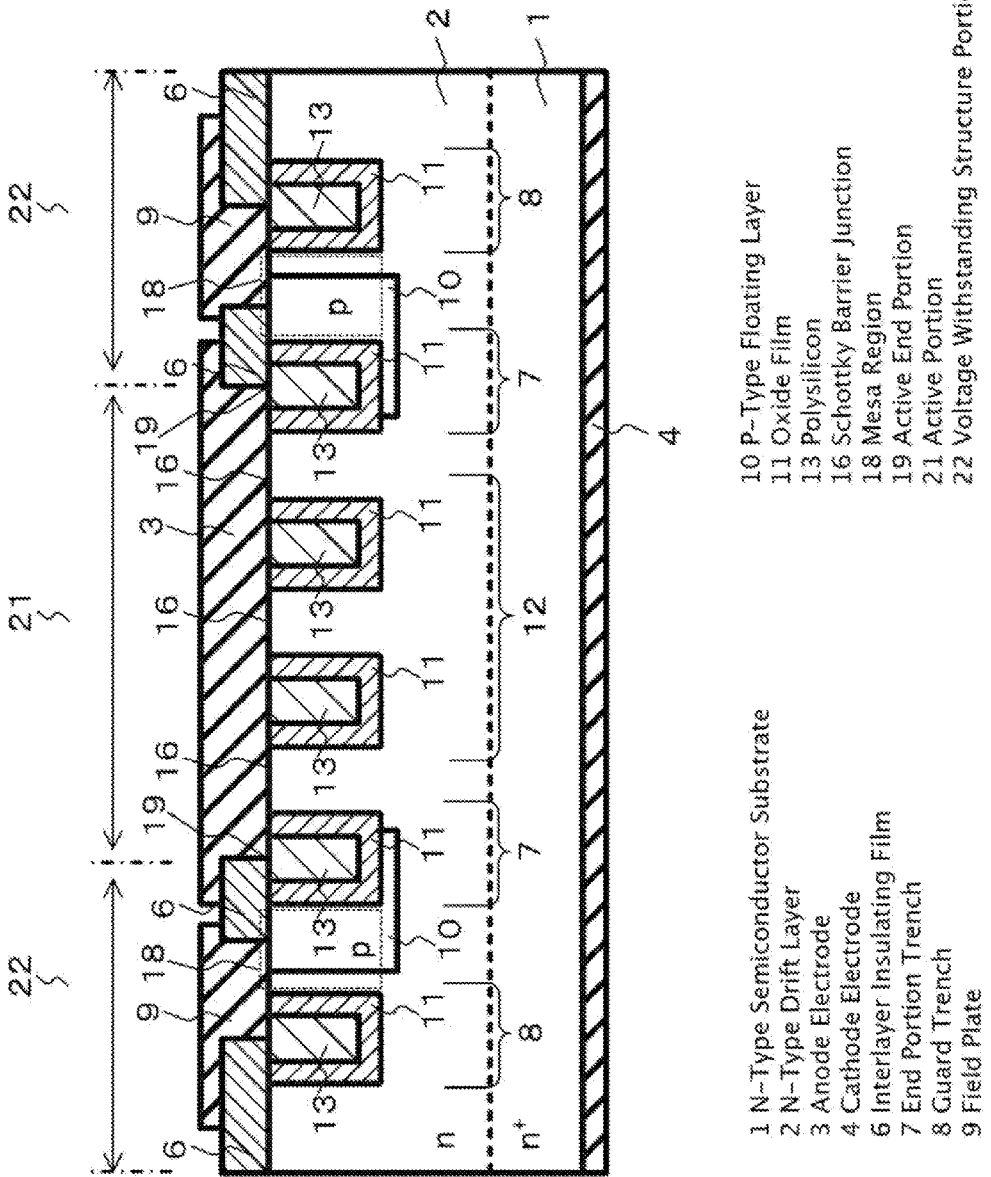
FIG. 3 is a sectional view showing important part of a semiconductor device according to an embodiment of the invention.

A TMBS diode according to Embodiment 3 of the invention will be described next with reference to FIG. 3. FIG. 3 is a sectional view of a TMBS diode according to Embodiment 3. The point of difference of Embodiment 3 from Embodiment 1 is as follows. P-type floating layer 10 is formed between end portion trench 7 and guard trench 8. P-type floating layer 10 abuts on end portion trench 7. P-type floating layer 10, n-type drift layer 2 and polysilicon 13 inside guard trench 8 are connected to one another through field plate 9. Because the depletion layer spread at the time of application of a reverse bias can reach p-type floating layer 10 ahead of guard trench 8, the effect of pulling the depletion layer (isoelectric lines) toward the outer circumferential side of the chip becomes further strong. As a result, electric field intensity in the vicinity of the bottom of end portion trench 7 and guard trench 8 is further relaxed. A further important characteristic is that p-type floating layer 10 is not connected to anode electrode 3, but is separated from anode electrode 3. That is, because p-type floating layer 10 does not abut on anode electrode 3, holes which are minority carriers are not injected into the drift layer so that electric field intensity can be relaxed. Although the depth of p-type floating layer 10 from the upper surface of n-type drift layer 2 may be smaller than the depth of end portion trench 7 or guard trench 8, it is preferable that p-type floating layer 10 is deeper than end portion trench 7 as shown in FIG. 3. When the junction depth of p-type floating layer 10 is larger than the depth of end portion trench 7 or guard trench 8, the depletion layer is spread from the pn junction of p-type floating layer 10. For this reason, the depletion layer is little spread to the bottom of end portion trench 7 or guard trench 8 which is located in a position shallower than the junction depth. As a result, electric field intensity in the bottom of end portion trench 7 little increases, so that the withstand voltage can be substantially determined only by the structure of the active region.

Figure 10A:
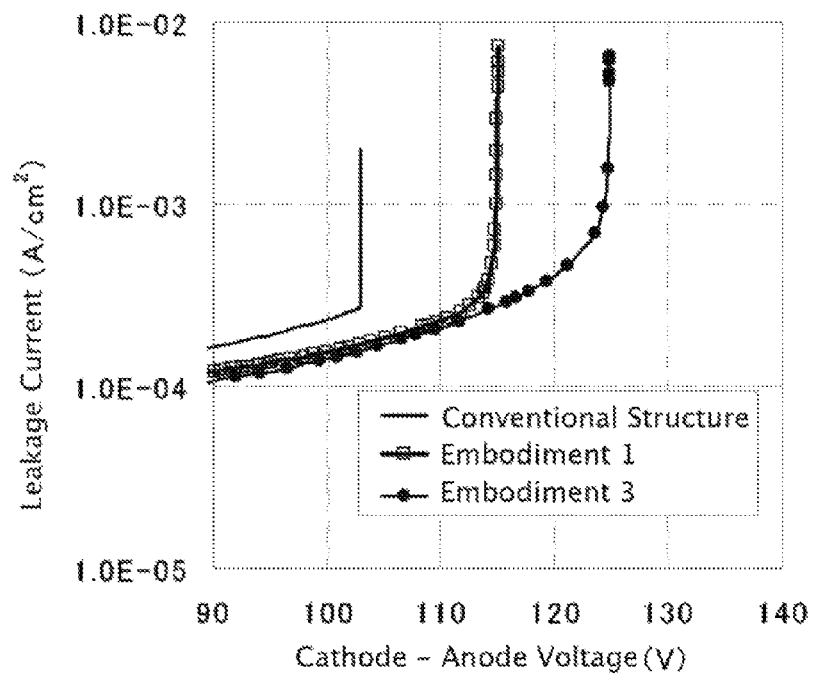
FIG. 10A is a characteristic graph showing current-voltage characteristics of semiconductor devices according to embodiments of the invention and the background art.
Figure 10B:
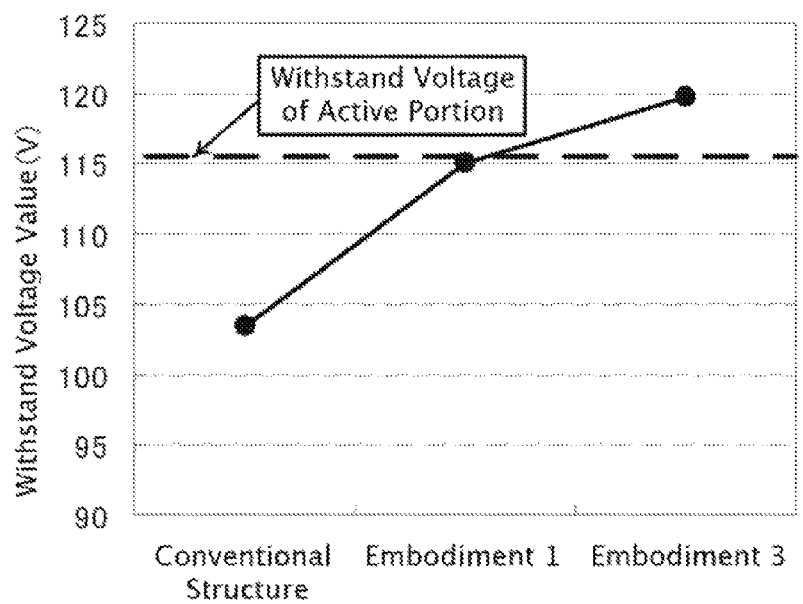
FIG. 10B is a characteristic relational graph showing electric characteristics of semiconductor devices according to embodiments of the invention.

FIG. 10A is a graph showing current-voltage curves in the conventional field plate structure and Embodiments 1 and 3 of the invention when a reverse bias voltage is applied. Here, $L_E$ in each curve is 20 μm. When a voltage in which a leakage current increases rapidly because an avalanche current flows is defined as a withstand voltage, the withstand voltage of the conventional field plate structure is 104V, the withstand voltage of Embodiment 1 is 115V and the withstand voltage of Embodiment 3 is 120V. FIG. 10B is a graph for comparison of withstand voltage values.

Figure 5C:
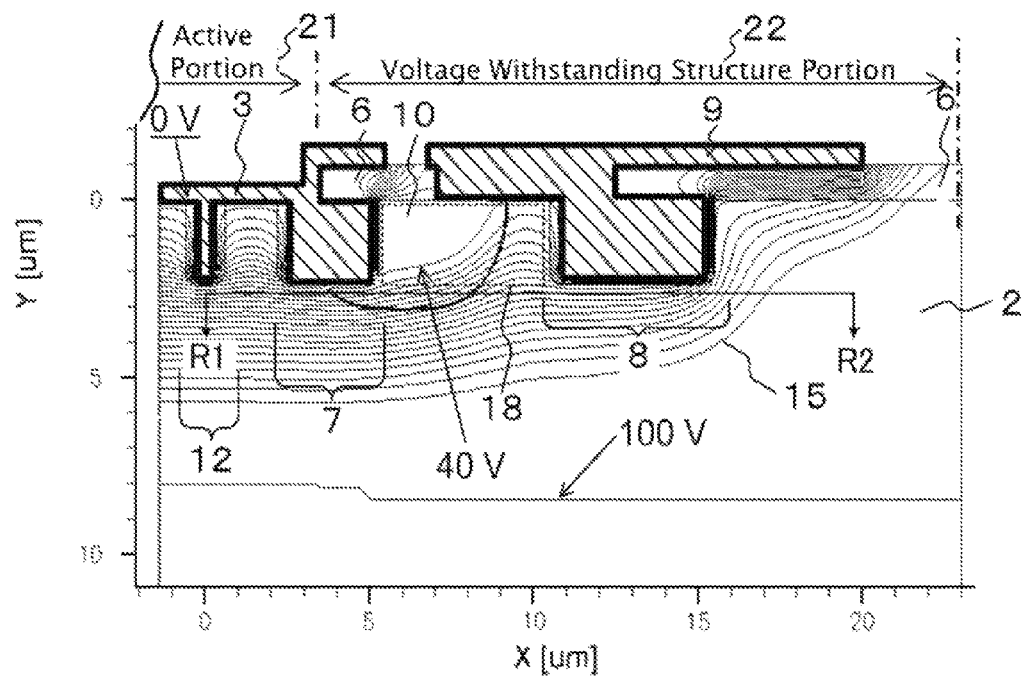
FIG. 5C is a sectional view showing characteristic of important part of a semiconductor device according to an embodiment of the invention.
Figure 7:
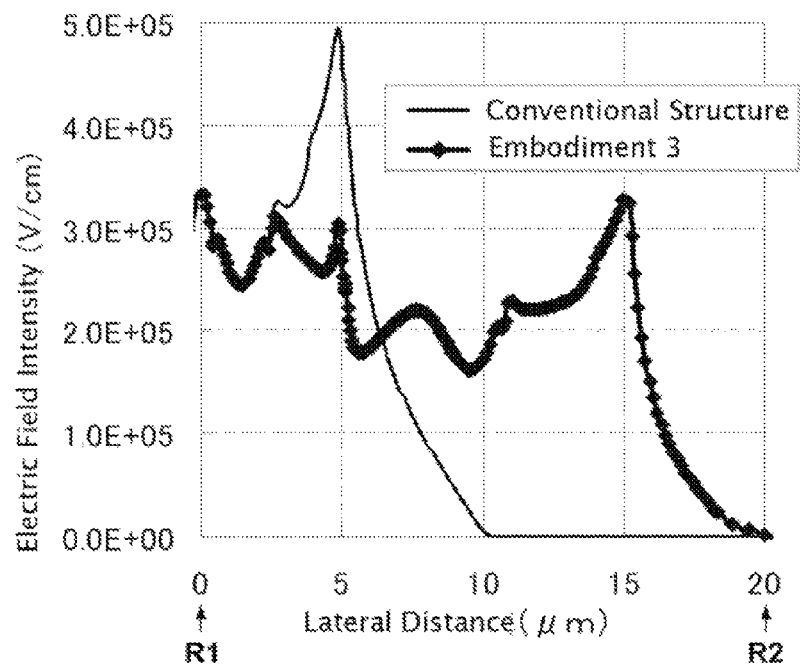
FIG. 7 is a characteristic graph showing electric characteristic in a depth direction of important part of a semiconductor device according to an embodiment of the invention.

The withstand voltage value of a structure having only active portion 21 is calculated as 115V. That is, it is found that the withstand voltage of the conventional field plate structure is lower than the ideal withstand voltage value determined only by active portion 21, that the withstand voltage of Embodiment 1 is equal to the value of active portion 21, and that the withstand voltage of Embodiment 3 is higher by 5V than the value defined only by active portion 21. This is an effect newly found in Embodiment 3 of the invention. This effect will be described below. FIG. 5C shows an electrostatic potential distribution of Embodiment 3 when a reverse bias voltage of 100V is applied to the TMBS diode. It is apparent from FIG. 5C that the electric potential of mesa region 18 applied to a range of from end portion trench 7 to guard trench 8 is extruded to the outer circumferential portion by p-type floating layer 10 so that the electric potential in the vicinity of guard trench 8 is lowered compared with the configuration of Embodiment 1 shown in FIG. 5B. That is, not only is the electric potential of mesa region 18 pulled to guard trench 8 side by guard trench 8 but also an effect of p-type floating layer 10 assisting pulling of the electric potential of mesa region 18 occurs. FIG. 7 shows an electric field intensity distribution on a section taken in the line of the positions R1-R2 on this occasion. The thick-line curve with markers shows Embodiment 3. Electric field intensity in a position at a lateral distance of 5 μm, that is, electric field intensity in the bottom of the end portion trench can be reduced to 60% compared with the value in the same position in the conventional field plate structure. Accordingly, it is conceivable that there is no avalanche current generated in voltage withstanding structure portion 22. Moreover, because the avalanche current generated in active portion 21 is distributed to the chip outer circumferential side which is a voltage withstanding portion, the current density of the avalanche current can be reduced compared with the avalanche current generated only in active portion 21. Because avalanche breakdown is a phenomenon that positive feedback is amplified by an avalanche current, the avalanche current in the TMBS diode is concentrated in a small cell pitch (about 3 μm) in active portion 21 so that amplification occurs easily. On the other hand, when voltage withstanding structure portion 22 in which there is no avalanche current generated is adjacent to active portion 21 as shown in Embodiment 3, the avalanche current is distributed from the active portion 21 to the voltage withstanding structure portion 22 so that an amplification effect of the avalanche current in active portion 21 is relaxed. Accordingly, the reverse bias voltage can be increased to a voltage slightly higher than the withstand voltage value determined only by active portion 21. This is the reason why the withstand voltage of Embodiment 3 is higher than the withstand voltage value determined only by active portion 21.

The provision of p-type floating layer 10 which floats as in the invention further brings the following advantage. That is, an increase in the withstand voltage of the chip from the value determined only by active portion 21 can be returned to increase in dopant concentration of n-type drift layer 2 in active portion 21 or reduction in thickness of n-type drift layer 2. As a result, a lower on-resistance TMBS diode which cannot be obtained by the conventional voltage withstanding structure can be obtained.

Embodiment 4

Figure 4:
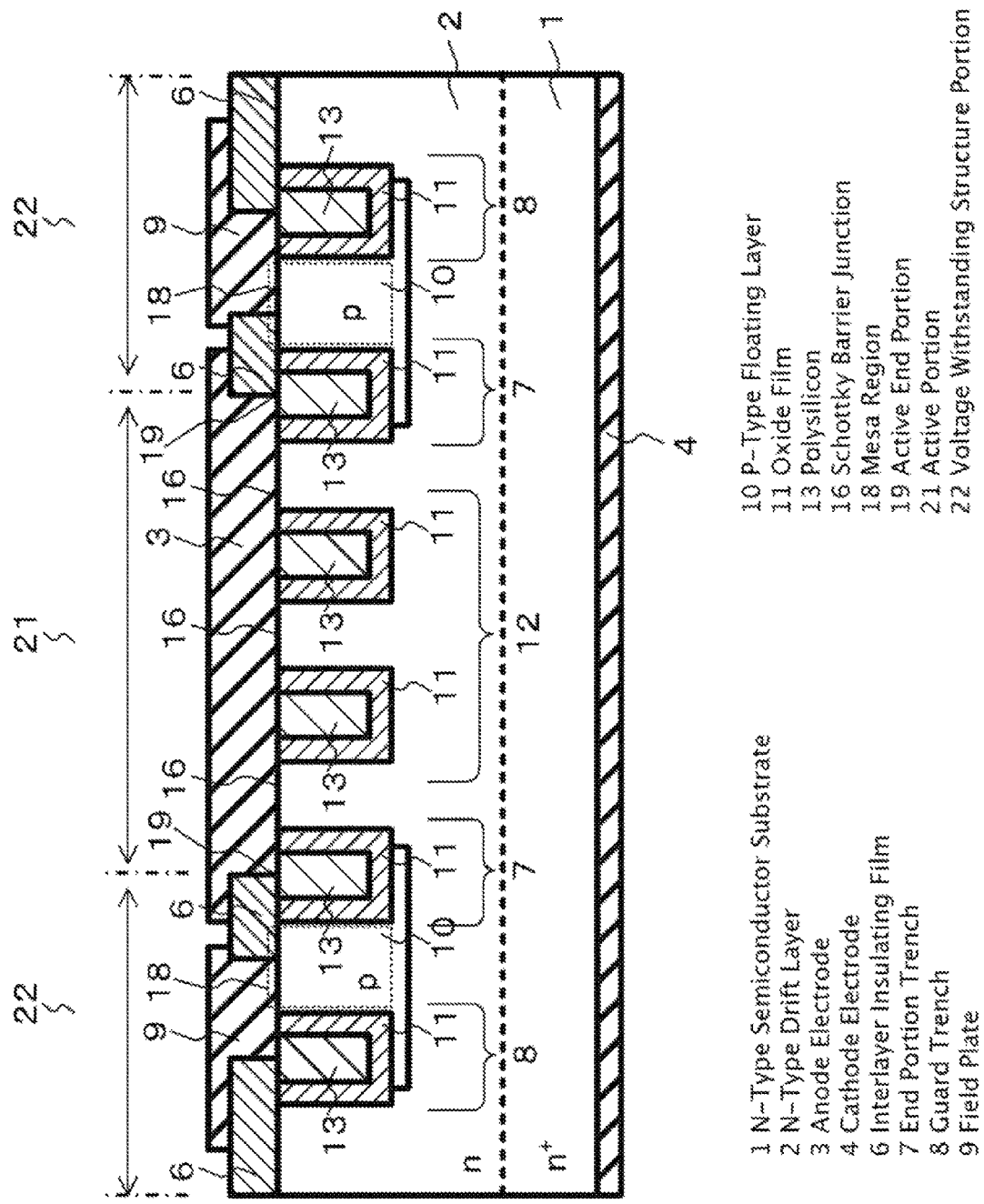
FIG. 4 is a sectional view showing important part of a semiconductor device according to an embodiment of the invention.

FIG. 4 is a view showing a section of a TMBS diode according to Embodiment 4 of the invention. The point of difference of Embodiment 4 from Embodiment 3 lies in that p-type floating layer 10 is formed so as to be in contact not only with end portion trench 7 but also with guard trench 8. In this manner, the depletion layer is more easily spread to the outer circumference of the chip. As a result, the withstand voltage value inclusive of voltage withstanding structure portion 22 can be made larger than the withstand voltage value determined only by active portion 21.

Embodiment 5

A method of manufacturing a lengthwise end portion of each active portion trench 12 and a preferred positional relation between active portion trench 12 and end portion trench 7 or guard trench 8 will be described next.

Figure 11A:
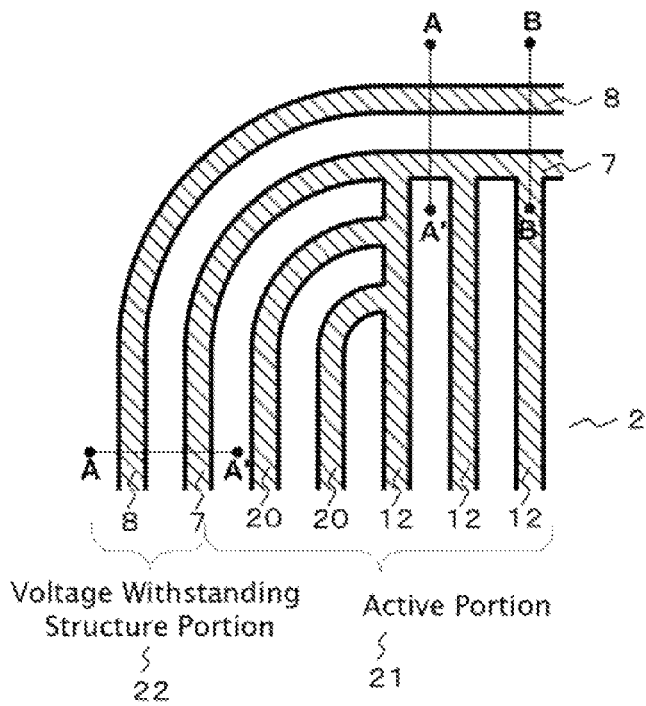
FIG. 11A is a plan view showing important part of a semiconductor device according to an embodiment of the invention.
Figure 11B:
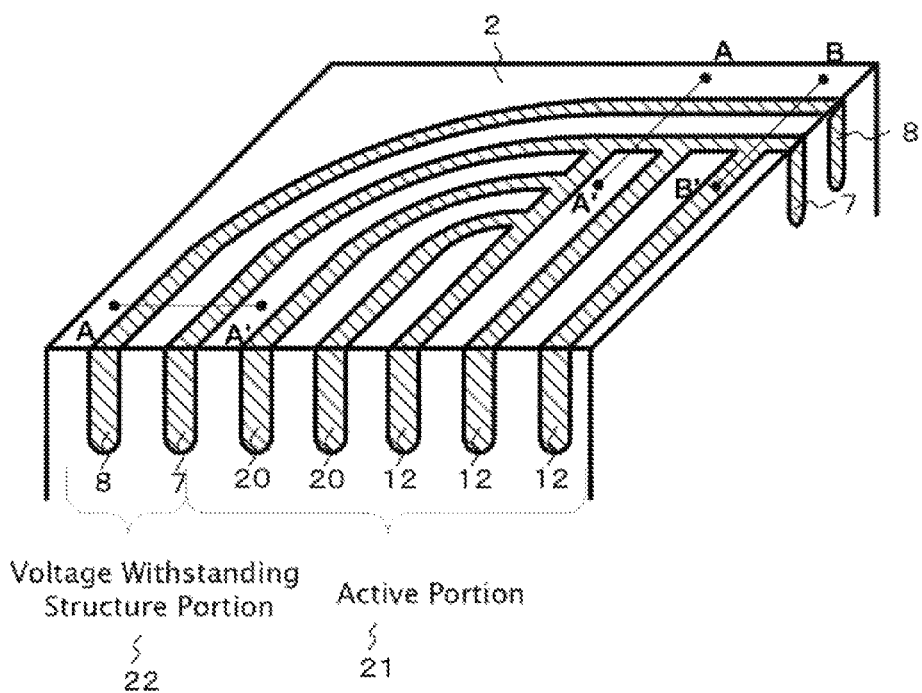
FIG. 11B is a perspective view showing important part of a semiconductor device according to an embodiment of the invention.
Figure 16A:
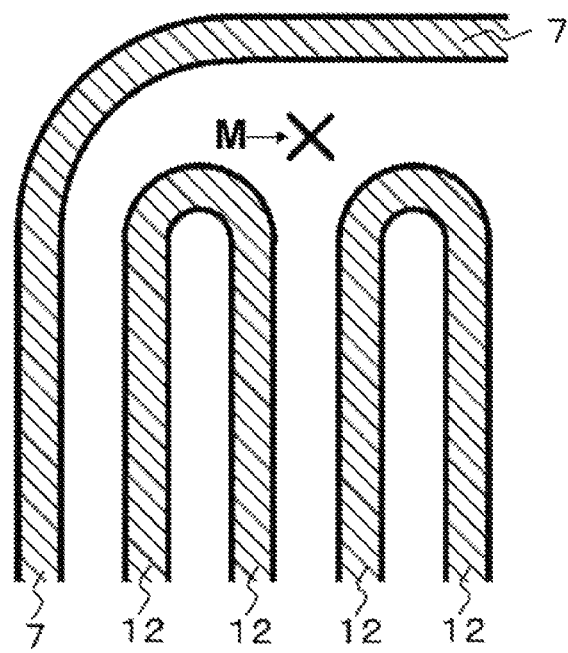
FIG. 16A is a plan view showing important part of a semiconductor device according to the background art.
Figure 16B:
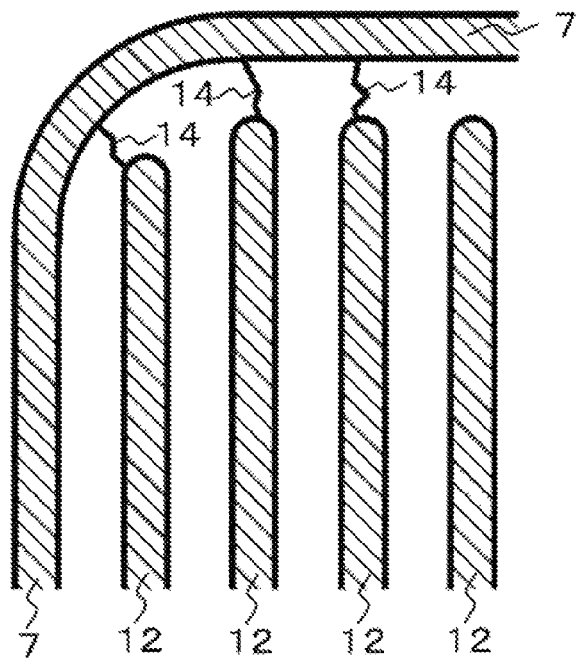
FIG. 16B is a plan view showing important part of a semiconductor device according to the background art.

FIG. 11A is a plan view showing a structure of active portion 21 and voltage withstanding structure portion 22 in Embodiment 5. The structure viewed obliquely is a structure as shown in FIG. 11B. Active portion trenches 12 in Embodiment 5 are shaped like stripes. The lengthwise end portions of striped active portion trenches 12 are connected to end portion trench 7. On the other hand, active curved trenches 20 shorter in length than active portion trenches 12 are provided between active portion trench 12 and end portion trench 7. Both ends of each active curved trench 20 are curved with a radius smaller than the curvature radius of a curved portion at each corner of end portion trench 7. Both ends of each active curved trench 20 are connected to an outermost one of active portion trenches 12. In this manner, an end portion small in curvature radius in the lengthwise direction of each trench as shown in FIG. 16A can be eliminated from the upper surface of the chip. Accordingly, increase in electric field intensity, cracking, etc. can be reduced sufficiently.

Embodiment 6

Figure 12A:
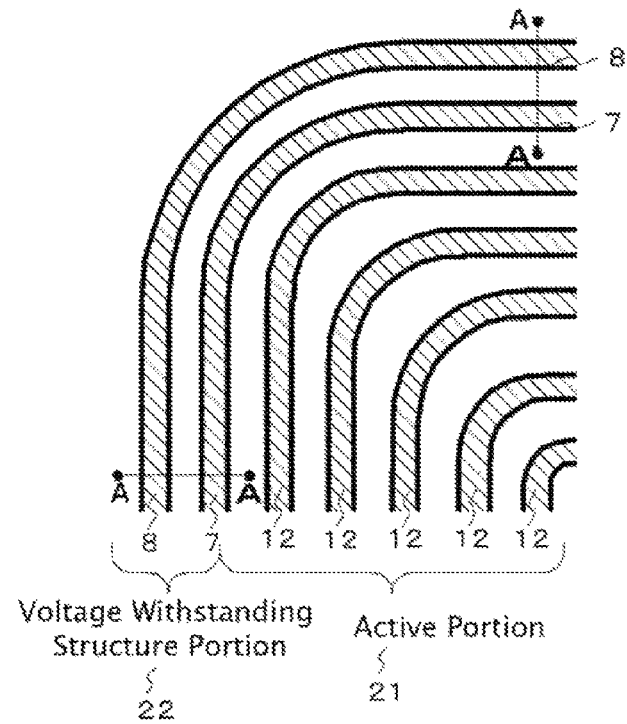
FIG. 12A is a plan view showing important part of a semiconductor device according to an embodiment of the invention.
Figure 12B:
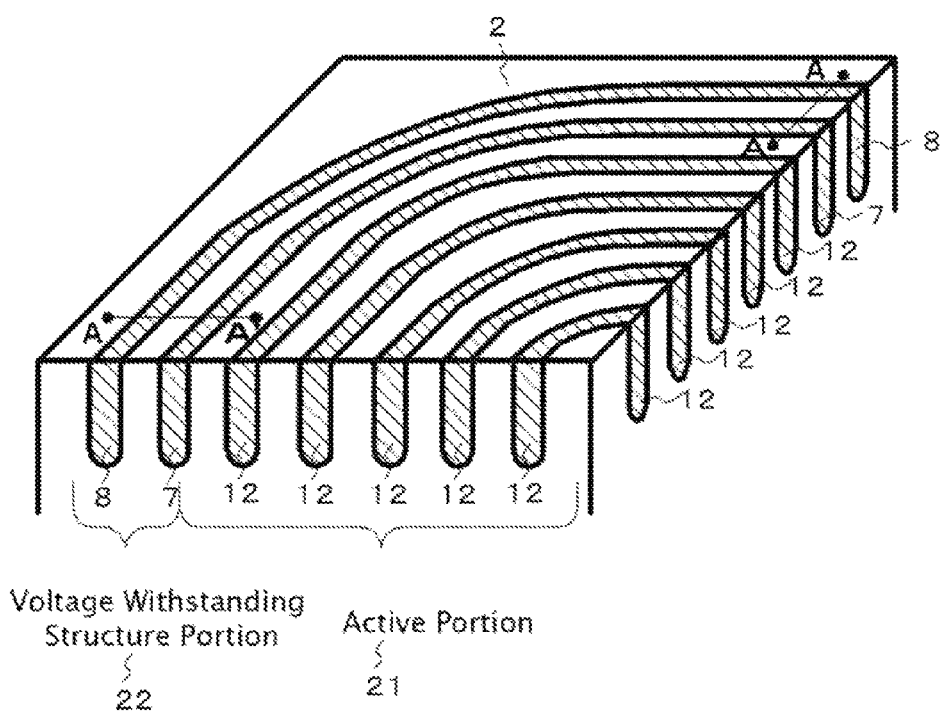
FIG. 12B is a perspective view showing important part of a semiconductor device according to an embodiment of the invention.

A method of manufacturing a lengthwise end portion of each active portion trench 12 and a preferred positional relation between active portion trench 12 and end portion trench 7 or guard trench 8 may be provided as shown in Embodiment 6 of the invention. FIG. 12A is a plan view showing a structure of active portion 21 and voltage withstanding structure portion 22 in Embodiment 6. The structure viewed obliquely is a structure as shown in FIG. 12B. In this structure, each active portion trench 12 is shaped like a doughnut in the same manner as end portion trench 7 or guard trench 8. Active portion trenches 12 are disposed so that the geometric center of gravity of all the trenches each shaped like a doughnut is located in mesa region 18 surrounded by active portion trench 12 of the innermost circumference formed in the vicinity of the center of the chip. In this manner, terminal ends of all of active portion trenches 12 are eliminated so that all of active portion trenches 12 become adjacent to one another at equal intervals. Accordingly, electric field intensity increases only in corner positions (hereinafter referred to as corner portions) where each trench is curved. Moreover, increase in electric field intensity can be ignored when the curvature radius of each trench is set to be large. When, for example, the curvature radius of active portion trenches 12 is not smaller than the pitch of active portion trenches 12 (which is a unit period in repetitive arrangement of adjacent active portion trenches 12 and which is hereinafter referred to as trench pitch), concentration of electric field intensity in corner portions can be suppressed sufficiently. The doughnut shape of each active portion trench 12 may be replaced by such a shape that corner portions of a quadrangle are chamfered as shown in FIG. 12A or may be replaced by a circular shape (such as a true circle or an ellipse) as long as the smallest curvature radius in the shape is equal to about the trench pitch. However, when the planar shape of each trench is circular, the area of ineffective regions increases in the vicinity of four corners of the chip (quadrangle). It is therefore preferable that the corner portions of a quadrangle are chamfered and rounded as described above. When the curvature radius of each corner portion is not larger than 1000 times as large as the trench pitch, the percentage occupied by ineffective regions can be reduced to 3% or less so that the presence of the ineffective regions can be ignored. The preferred curvature radius range (not smaller than the trench pitch and not larger than 1000 times as much as the trench pitch) of each corner portion can be applied not only to Embodiment 6. For example, the preferred range may be applied to the curvature radius of end portion trench 7, guard trench 8 or the corner portion of one of active portion trenches 12 near the end portion trench in Embodiment 5. In this manner, the effect of preventing concentration of electric field intensity and occurrence of cracks in the trench end portion in any trench can be obtained.

Figure 13A:
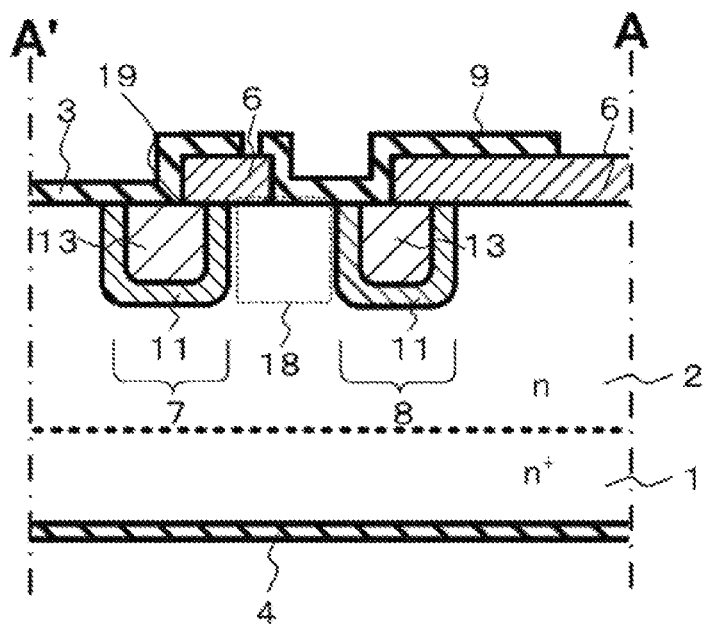
FIG. 13A is a sectional view showing important part of a semiconductor device according to an embodiment of the invention.
Figure 13B:
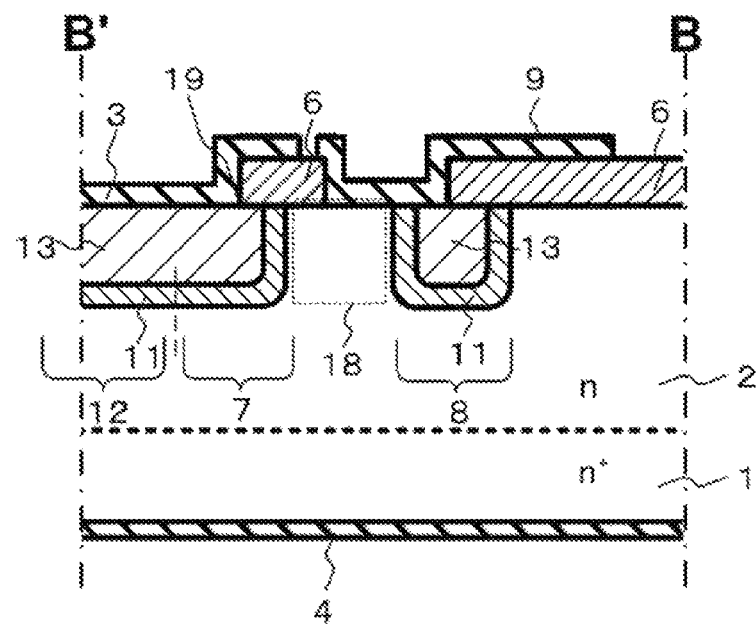
FIG. 13B is a sectional view showing important part of a semiconductor device according to an embodiment of the invention.

The sectional shapes of end portion trench 7 and guard trench 8 in Embodiments 5 and 6 will be described here. FIG. 13A shows the sectional shape in a range of position A to position A' shown in each of FIGS. 11A, 11B, 12A and 12B. FIG. 13B shows the sectional shape in a range of position B to position B' shown in FIGS. 11A and 11B. The section shown in FIG. 13A is a section of a place perpendicular to the lengthwise direction of end portion trench 7 and guard trench 8 arranged in parallel to each other. For example, FIG. 13A shows the same shape as shown in FIG. 1, etc. On the other hand, FIG. 13B shows a section in a position where active portion trench 12 intersects perpendicularly end portion trench 7. In this case, FIG. 13B shows the shape of active portion trench 12 continued in the lengthwise direction in the line B-B' but the chip outer circumferential side terminal shape of end portion trench 7 is the same as that shown in FIG. 1, etc. Accordingly, mesa region 18 between end portion trench 7 and guard trench 8, the form of connection between mesa region 18 and field plate 9 and the form of connection between field plate 9 and polysilicon 13 inside guard trench 8 are the same as those shown in FIG. 13A. Accordingly, the operation and effect of the invention can be obtained likewise regardless of the form of connection between active portion trench 12 and end portion trench 7, so that an electrically weak portion can be prevented from being generated in a specific portion by processing of the end portion of active portion trench 12.

Embodiment 7

Figure 14:
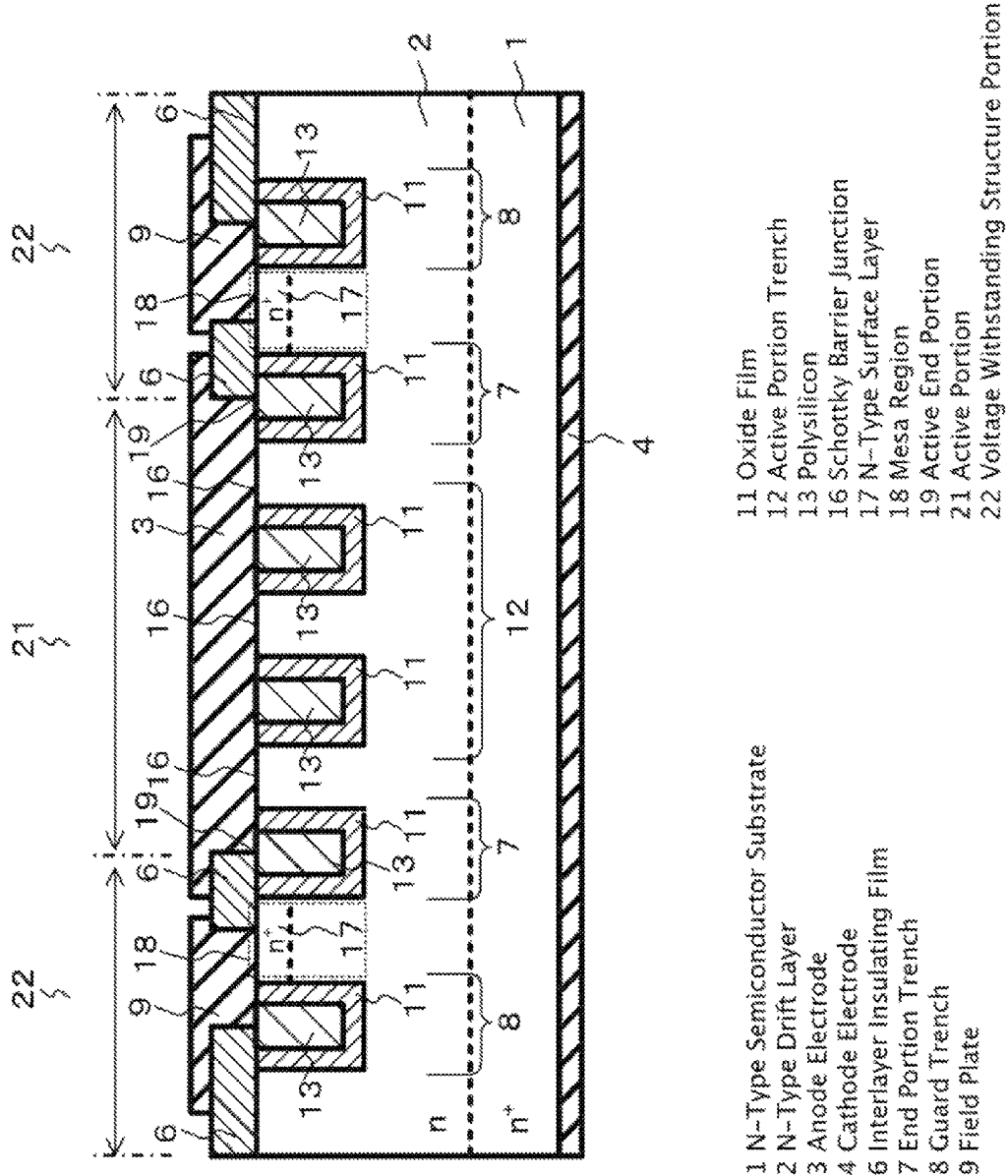
FIG. 14 is a sectional view showing important part of a semiconductor device according to an embodiment of the invention.
Figure 15:
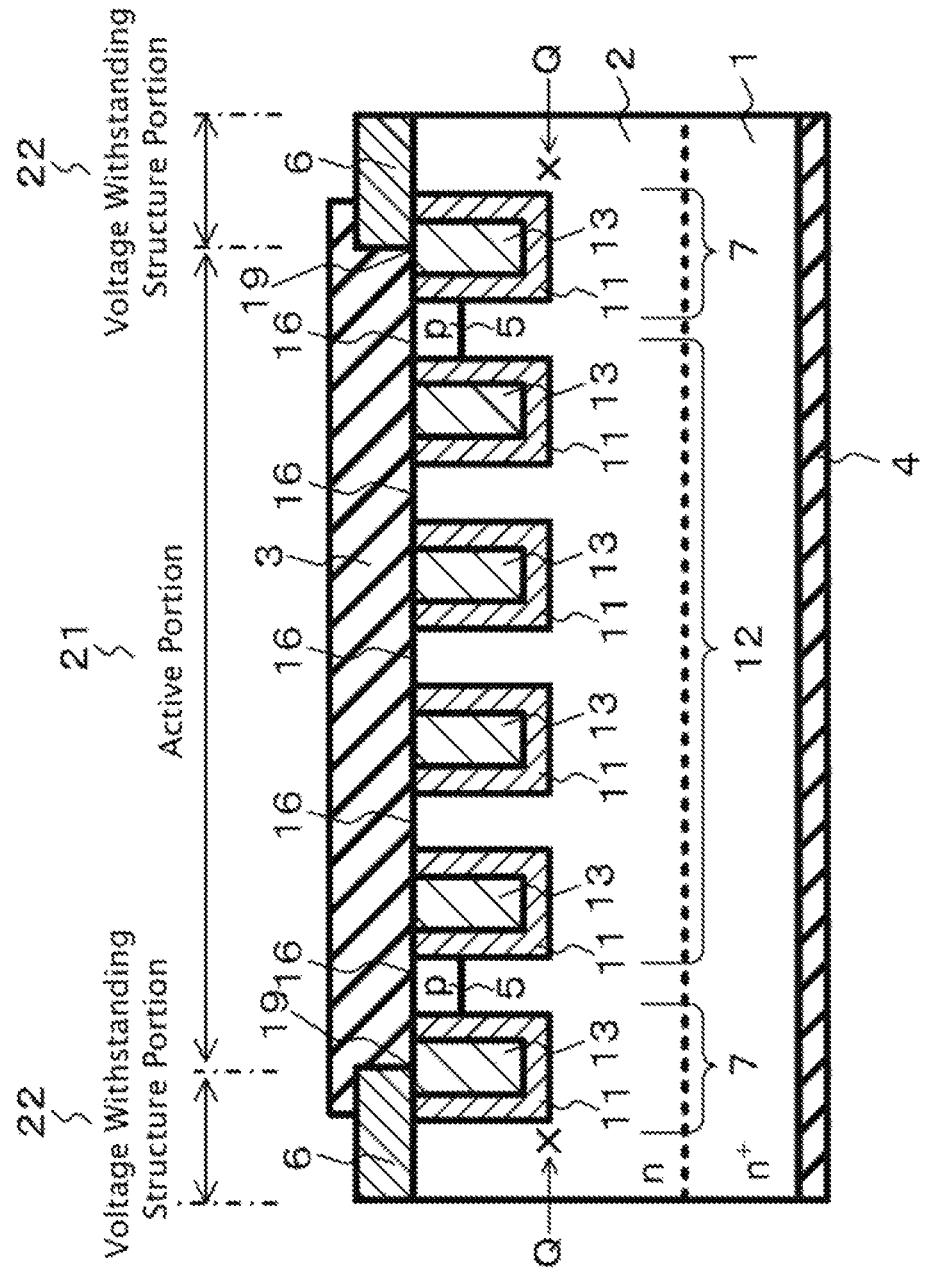
FIG. 15 is a sectional view showing important part of a semiconductor device according to the background art.

A TMBS diode according to Embodiment 7 of the invention will be described next with reference to FIG. 14. The point of difference of Embodiment 7 from Embodiment 1 lies in that n-type surface layer 17 higher in concentration than n-type drift layer 2 is formed in a surface of mesa region 18 between end portion trench 7 and guard trench 8. For example, the concentration of n-type surface layer 17 is set to be in a range of from twice to ten times as much as that of n-type drift layer 2. When there is n-type surface layer 17, the distribution of isoelectric lines 15 may be changed because the surface layer of mesa region 18 is electrostatically charged when electric charge enters the chip surface from the outside of the chip. In this case, for example, not only channels of holes are formed in the surface layer of mesa region 18 to thereby bring increase in leakage current but also the withstand voltage may be reduced because the electric field intensity distribution is changed to thereby generate a portion where large electric field intensity is locally concentrated in the surface layer of mesa region 18. When n-type surface layer 17 shown in Embodiment 7 of the invention is formed, the surface layer of mesa region 18 is hardly electrostatically charged at the time of entrance of external electric charge because the n-type dopant concentration of the surface layer of mesa region 18 is high. For this reason, formation of hole channels or change in the distribution of electric field intensity hardly occurs at the time of entrance of external electric charge so that the withstand voltage or the leakage current is kept stable. The aforementioned effect can be obtained when the maximum concentration of n-type surface layer 17 is larger than the concentration of n-type drift layer 2. The effect is sufficient when the maximum concentration of n-type surface layer 17 is not smaller than about twice as much as the concentration of n-type drift layer 2. However, because isoelectric lines cross the high-concentration n-type surface layer 17, the distribution of isoelectric lines is changed according to the concentration. If the concentration of n-type surface layer 17 is higher than 10 times as much as the concentration of n-type drift layer 2, electric field intensity is concentrated in n-type surface layer 17 so that the withstand voltage is lowered. It is therefore preferable that the concentration of n-type surface layer 17 is not larger than 10 times as much as the concentration of n-type drift layer 2. If n-type surface later 17 becomes deeper than either end portion trench 7 or guard trench 8, the distribution of isoelectric lines is changed in the same manner so that electric field intensity is apt to be locally concentrated. It is therefore preferable that n-type surface layer 17 is shallower than both or either of end portion trench 7 and guard trench 8.

Though not shown, n-type surface layer 17 may be formed in a region where p-type floating layer 10 is not formed in mesa region 18 between end portion trench 7 and guard trench 8 in the structure of Embodiment 3 shown in FIG. 3. In this case, n-type surface layer 17 is formed so as to be in contact with only field plate 9 but separated from interlayer insulating film 6. In this manner, isoelectric lines do not cross n-type surface layer 17 because the isoelectric lines extend from p-type floating layer 10 toward guard trench 8 substantially directly. Accordingly, the maximum concentration of n-type surface layer 17 can be made higher than that in the aforementioned case, so that the withstand voltage can be made more stable against external electric charge.

Thus, a semiconductor device has been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

This application is based on and claims priority to Japanese Patent Application 2010-000469, filed on Jan. 5, 2010. The disclosure of the priority application in its entirety, including the drawings, claims, and the specification thereof, is incorporated herein by reference.

What is claimed is:

1. A semiconductor device comprising:
a cathode layer made of a first conductivity type semiconductor substrate;
a drift layer provided on one principal surface of the cathode layer and made of a first conductivity type semiconductor substrate lower in concentration than the cathode layer;
at least one first trench and an end portion trench provided in an upper surface of the drift layer so that the first trench is surrounded by the end portion trench;
a first conductor embedded in each of the first trench and the end portion trench through an insulating film;
an anode electrode provided on the upper surface of the drift layer so that the anode electrode is in contact with the first conductor, and that a Schottky barrier junction is formed between the anode electrode and the drift layer; and
a cathode electrode provided on the other principal surface of the cathode layer, wherein:
an outer circumferential side end portion of the anode electrode is in contact with the first conductor of the end portion trench;
a field plate is provided separately from the anode electrode;
a second trench is provided separately from the end portion trench so that the end portion trench is surrounded by the second trench;
a second conductor is embedded in the second trench through an insulating film; and
the field plate is in contact with the second conductor and with the drift layer in a mesa region between the end portion trench and the second trench, wherein a distance W1 from an outer circumferential side sidewall of the end portion trench to a position P of an inner circumferential side end portion of a region where the field plate and the drift layer are in contact with each other is smaller than a distance W2 from the position P to an inner circumferential side end portion of the second trench.

2. A semiconductor device according to claim 1, wherein a width of the end portion trench is larger than a width of the first trench.

3. A semiconductor device according to claim 1, further comprising a third trench disposed between the first trench and the end portion trench so that a linear portion of the third trench is shorter than that of the first trench, that both ends of the third trench are curved with a smaller radius than a curvature radius of the end portion trench, and that the both ends of the third trench are connected to outermost one of the first trenches.

4. A semiconductor device according to claim 1, wherein each first trench is shaped like a doughnut on the upper surface of the drift layer, and a geometric center of gravity of the first trenches each shaped like a doughnut is located inside an innermost one of the first trenches.

5. A semiconductor device according to claim 1, wherein a second conductivity type floating layer formed on the upper surface of the drift layer so as to be connected to both or either of the end portion trench and the second trench and connected to the field plate is disposed so as to be separated from the anode electrode, and depth of the floating layer from the upper surface of the drift layer is larger than depths of both of the end portion trench and the second trench or depth of either of the end portion trench and the second trench.

6. A semiconductor device according to claim 5, wherein the floating layer is in contact with both of the end portion trench and the second trench.

7. A semiconductor device according to claim 1, wherein a first conductivity type surface layer having a higher concentration than the concentration of the drift layer and being shallower than both or either of the end portion trench and the second trench is formed on a surface of the drift layer sandwiched between the end portion trench and the second trench.

8. A semiconductor device according to claim 7, wherein maximum concentration of the surface layer is not lower than a value exhibited by the drift layer and not higher than 10 times as much as the value exhibited by the drift layer.

* * * * *